United States Patent
Baranauskas et al.

(10) Patent No.: US 7,852,152 B2
(45) Date of Patent: Dec. 14, 2010

(54) $N^{th}$ ORDER TUNABLE LOW-PASS CONTINUOUS TIME FILTER FOR FIBER OPTIC RECEIVERS

(75) Inventors: Dalius Baranauskas, Pacific Palisades, CA (US); Denis Zelenin, Rancho Palos Verdes, CA (US); Matthias Bussmann, Los Angeles, CA (US); Salam Elahmadi, Dallas, TX (US)

(73) Assignee: Menara Networks, Dallas, TX (US)

( * ) Notice: Subject to any disclaimer, the term of this patent is extended or adjusted under 35 U.S.C. 154(b) by 21 days.

(21) Appl. No.: 12/200,773

(22) Filed: Aug. 28, 2008

(65) Prior Publication Data

US 2010/0052778 A1 Mar. 4, 2010

(51) Int. Cl. *H03F 1/36* (2006.01)
(52) U.S. Cl. ........... 330/109; 330/85
(58) Field of Classification Search ........... 330/109, 330/85, 310, 305; 327/552–553
See application file for complete search history.

(56) References Cited

U.S. PATENT DOCUMENTS

| | | | |
|---|---|---|---|
| 3,959,729 A | 5/1976 | Marchetti | |
| 4,135,203 A | 1/1979 | Friedman | |
| 4,448,494 A | 5/1984 | Freyre | |
| 4,460,250 A | 7/1984 | Freyre | |
| 4,530,084 A | 7/1985 | Strebel et al. | |
| 4,710,914 A | 12/1987 | Robieux | |
| 4,916,705 A | 4/1990 | Glance | |
| 4,995,048 A | 2/1991 | Kuindersma et al. | |
| 5,013,116 A | 5/1991 | Yamazaki et al. | |
| 5,020,153 A | 5/1991 | Choa et al. | |
| 5,184,241 A | 2/1993 | Schwemmer | |
| 5,305,402 A | 4/1994 | Hill et al. | |
| 5,384,651 A | 1/1995 | Van de Voorde et al. | |
| 5,452,118 A | 9/1995 | Maruska | |
| 5,455,701 A | 10/1995 | Eng et al. | |
| 5,502,783 A | 3/1996 | Wu | |
| 5,515,461 A | 5/1996 | Deri et al. | |
| 5,537,634 A | 7/1996 | Fye | |
| 5,594,577 A | 1/1997 | Majima et al. | |
| 5,821,825 A | 10/1998 | Kobayashi | |
| 5,864,416 A | 1/1999 | Williams | |
| 5,933,264 A | 8/1999 | Van Der Heijden | |
| 5,966,229 A | 10/1999 | Dodley et al. | |
| 6,018,582 A | 1/2000 | Francois et al. | |
| 6,072,925 A | 6/2000 | Sakata | |
| 6,141,126 A | 10/2000 | Lahat et al. | |
| 6,204,959 B1 | 3/2001 | Fujita et al. | |
| 6,321,011 B2 | 11/2001 | Deacon | |
| 6,415,074 B1 | 7/2002 | Donald et al. | |

(Continued)

*Primary Examiner*—Robert Pascal
*Assistant Examiner*—Hieu P Nguyen
(74) *Attorney, Agent, or Firm*—Blakely, Sokoloff, Taylor & Zafman LLP

(57) ABSTRACT

According to one embodiment of the invention, a circuit comprising a plurality of operational transconductance amplifiers (OTAS) is described. The first OTA has differential input and differential output. The second OTA also has differential input, where a first output of the first OTA is coupled to the first differential input of the second OTA, which is an inverting input. A second output of the first OTA is coupled to the second input of the second OTA, which is a non-inverting input. The first differential output being coupled to a first input of the first OTA and the second differential output being coupled to a second input of the first OTA for negative feedback and current biasing.

9 Claims, 25 Drawing Sheets

U.S. PATENT DOCUMENTS

| | | |
|---|---|---|
| 6,417,944 B1 | 7/2002 | Lahat et al. |
| 6,549,313 B1 | 4/2003 | Doerr et al. |
| 7,180,364 B2 * | 2/2007 | Kimura ........................ 327/553 |
| 7,330,667 B2 | 2/2008 | Fells |
| 7,599,596 B1 | 10/2009 | Feng et al. |
| 2002/0101641 A1 | 8/2002 | Kurchuk |
| 2002/0172458 A1 | 11/2002 | Downie |
| 2003/0174311 A1 | 9/2003 | Wilson et al. |
| 2003/0174313 A1 | 9/2003 | He et al. |
| 2003/0180047 A1 | 9/2003 | Way et al. |
| 2003/0202733 A1 | 10/2003 | Duelk et al. |
| 2004/0000635 A1 | 1/2004 | Wielandy et al. |
| 2004/0037301 A1 | 2/2004 | Shachar et al. |
| 2004/0125374 A1 | 7/2004 | Berger et al. |
| 2004/0208544 A1 | 10/2004 | Ovadia |
| 2005/0002628 A1 | 1/2005 | Rahman et al. |
| 2005/0013613 A1 | 1/2005 | Stevenson et al. |
| 2006/0275034 A9 | 12/2006 | Way et al. |
| 2007/0030562 A1 | 2/2007 | Fisher |
| 2007/0031150 A1 | 2/2007 | Fisher et al. |
| 2007/0140703 A1 | 6/2007 | Fells |
| 2007/0154217 A1 | 7/2007 | Kim et al. |
| 2007/0166045 A1 | 7/2007 | Wang |
| 2007/0177840 A1 | 8/2007 | Raddatz |
| 2007/0188852 A1 | 8/2007 | Fisher |
| 2007/0258722 A1 | 11/2007 | Yu |
| 2007/0286605 A1 | 12/2007 | Feuer et al. |
| 2008/0232803 A1 | 9/2008 | Maier |
| 2008/0259340 A1 | 10/2008 | Prasad et al. |
| 2008/0267627 A1 | 10/2008 | Effenberger |
| 2008/0279565 A1 | 11/2008 | Shu |
| 2009/0010435 A1 | 1/2009 | Zbinden |
| 2009/0097849 A1 | 4/2009 | Childers et al. |
| 2009/0140278 A1 | 6/2009 | Koyama et al. |
| 2009/0148171 A1 | 6/2009 | Chen et al. |
| 2009/0202248 A1 | 8/2009 | Zhang et al. |
| 2009/0220246 A1 | 9/2009 | Khurgin et al. |
| 2010/0163733 A1 | 7/2010 | Prasad et al. |

* cited by examiner

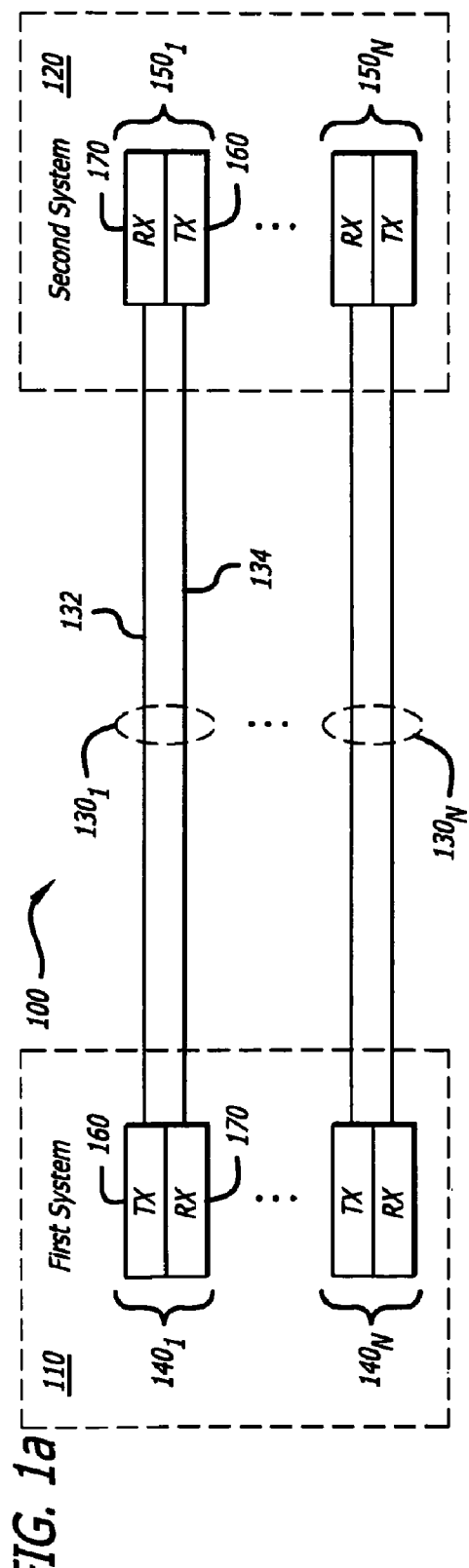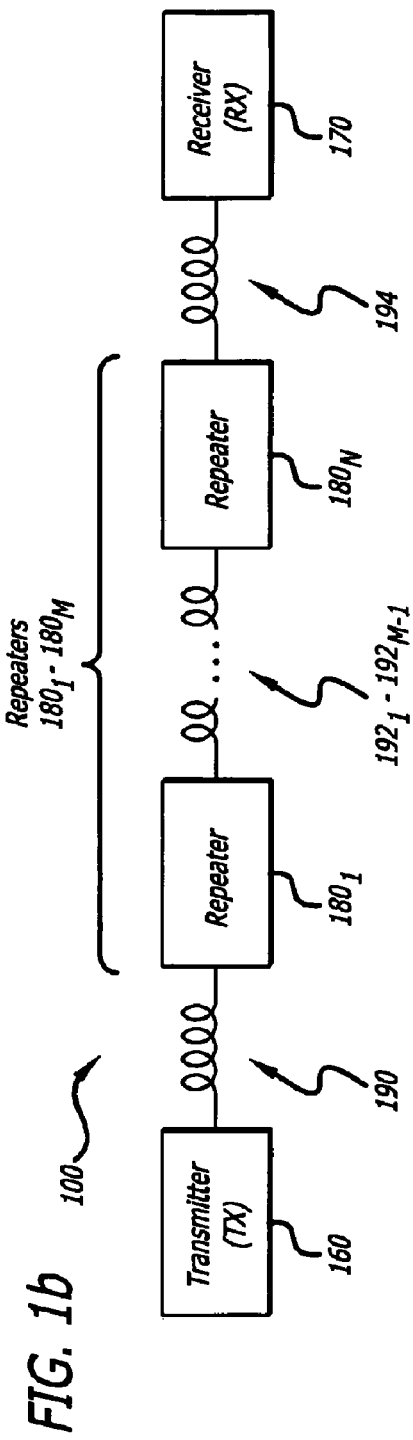

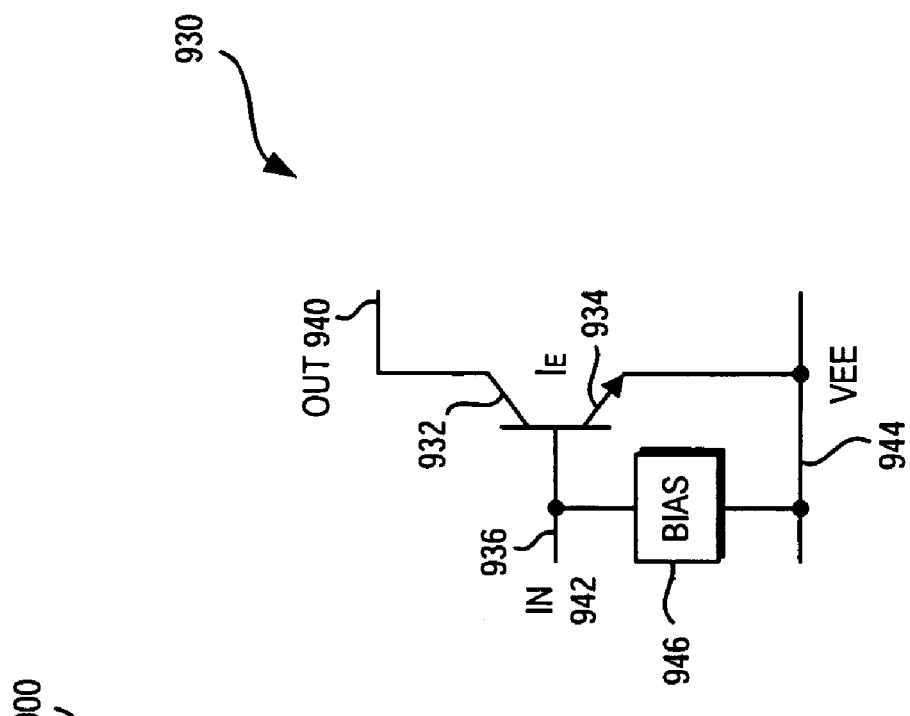
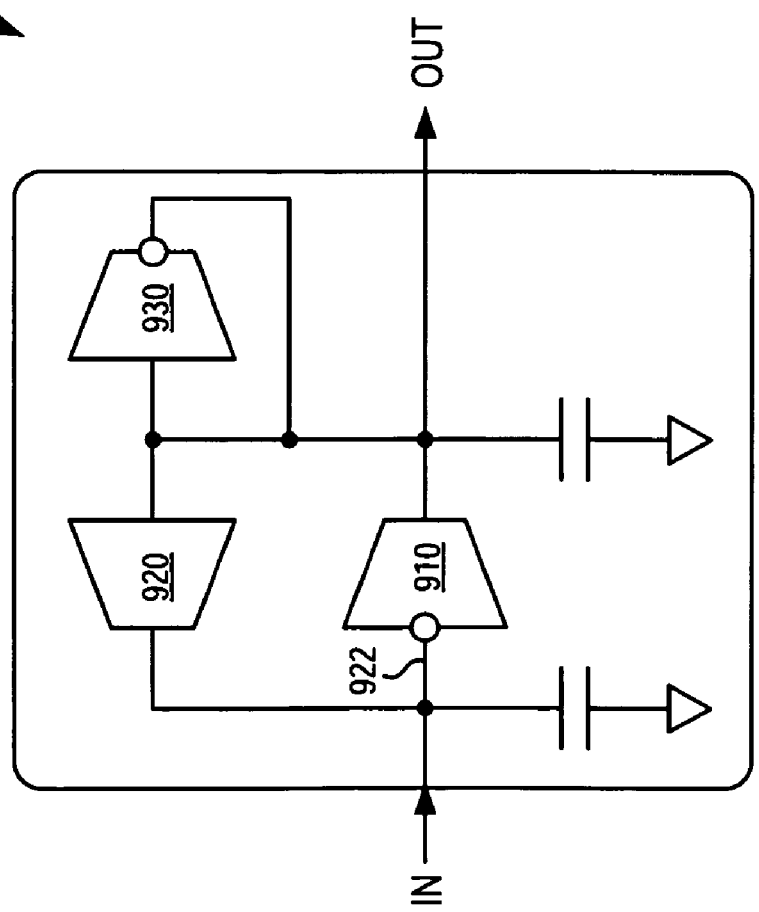
FIG. 9b
FIG. 9a ized to lower the cost of today's optical communications networks, enhance their performance, streamline and simplify their deployment and operation. This need has lead to an improved continuous time filtering as described below.

$N^{th}$ ORDER TUNABLE LOW-PASS CONTINUOUS TIME FILTER FOR FIBER OPTIC RECEIVERS

FIELD

Embodiments of the invention generally relate to optical data links including wavelength division multiplexing (WDM) fiber optic transmitters, receivers and transceivers. Particularly, embodiments of the invention relate to an $N^{th}$ order tunable low-pass filter implemented with differential operational transadmittance amplifiers (OTAS) and bias control circuitry.

GENERAL BACKGROUND

In order to lower the cost of communications, it has become desirable to increase the data rate and the number of communication channels available. This is particularly true in fiber optic communication systems.

In fiber optic communication systems, wavelength division multiplexing (WDM) has been used over the same fiber optic communication link so that multiple channels of communication may be established over one fiber optic cable. The multiple channels of communication are established at different center wavelengths of light. However, the complexity of WDM and its higher data rates makes it expensive to use in low cost applications.

In the data link between fiber-optic transceivers, an emphasis has been placed on improving the electrical-to-optical (EO) and optical-to-electrical (OE) elements in order to provide for the increased data rates over the fiber optic cables. For example, the laser driver driving a semiconductor laser has been improved in order to maintain a wide data eye from transmitter to receiver and avoid data bit errors at high data rates. While these improvements have marginally increased the data rate, they have not alleviated the need for high capacity optical links with lower cost and simpler operation.

Additionally, the medium of the fiber optic cable used has been compensated for various optical signal impairments in order to accommodate higher data rates and reduce some types of distortion. However, current compensation techniques operating in the optical domain are bulky, expensive, and consume too much power. Moreover, these techniques only compensate for one type of distortion at a time, such as chromatic dispersion, and ignore other types of distortions. Furthermore, adding optical signal distortion compensators along an optical cable renders the network provisioning process more complicated and significantly increases the network operational expenses. Additionally, replacing existing lower data rate engineered fiber optic cables with compensated cables to lower distortion and to support higher data rates is very expensive.

In the electrical domain, however, continuous time filters (CTFs) are important features for distortion reduction, especially when used as part of electrical dispersion compensation (EDC) circuitry in fiber optic transceivers. However, current CTFs tend to utilize passive components, such as inductors and resistors, in their design. These passive components suffer from significant impedance variations, especially in response to process variations. These impedance variations may adversely affect the the yield of EDC ASICs and reliability of the fiber optic transceivers. Also, these passive components are unsuitable for on-chip implementations that have significant size constraints.

The need for improved, cost-efficient distortion-mitigating techniques is important to lower the cost of today's optical

BRIEF DESCRIPTION OF THE DRAWINGS

Features and advantages of embodiments of the invention will become apparent from the following detailed description in which:

FIG. 1A is an exemplary block diagram of a fiber-optic communication system.

FIG. 1B is an exemplary block diagram of a more detailed version of the fiber-optic communication system.

FIG. 9A is an exemplary embodiment of a single-ended bi-quad circuit.

FIG. 9B is an exemplary embodiment of an inverting single-ended OTA.

DETAILED DESCRIPTION

Figure 2:
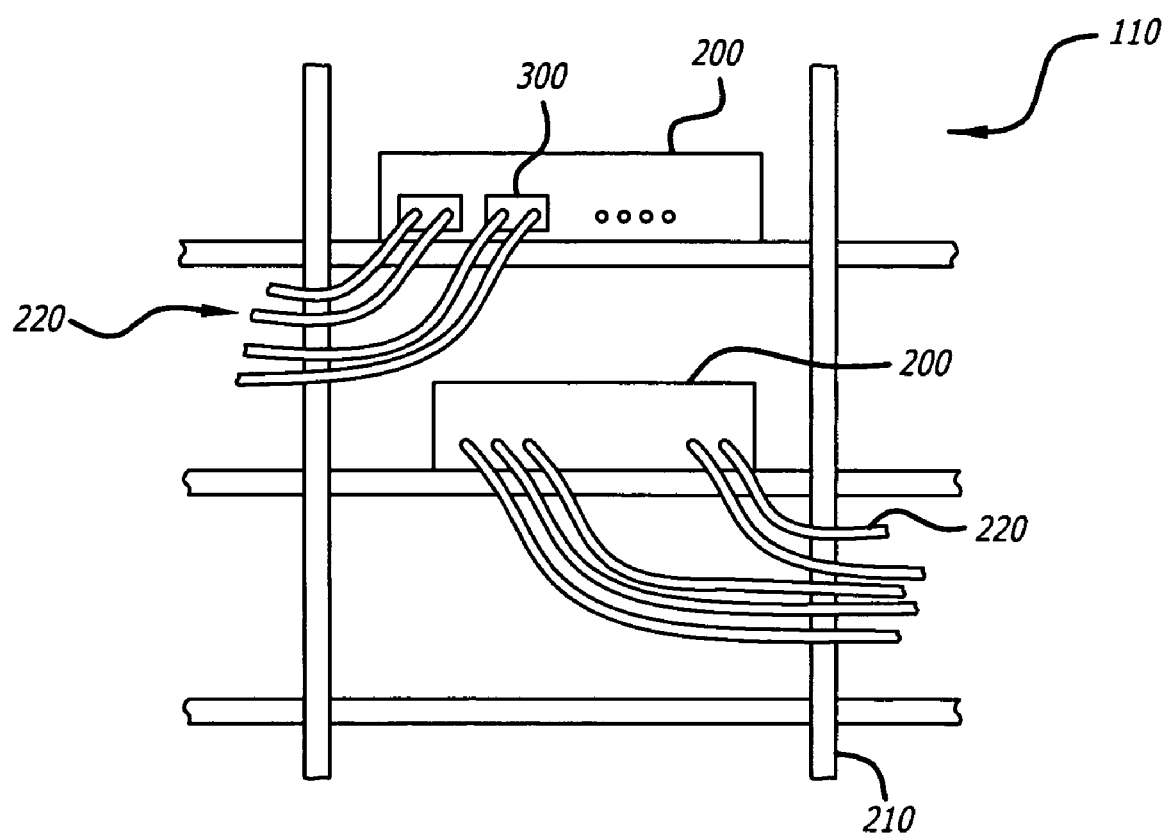
FIG. 2 illustrates a perspective embodiment of first system of the fiber-optic communication systems of FIGS. 1A-1B.

Embodiments of the invention set forth in the following detailed description generally relate to methods, apparatus, software, and systems for mitigating the distortions, both linear and nonlinear, that affect light pulses as they propagate over an optical fiber medium.

The embodiments of the invention are directed to a chip system that features a tunable continuous time filter (CTF) that is less susceptible to power supply noise and environmental conditions that tend to increase impedance variations normally found with components used to form the CTF. The CTF comprises differential Operational Transadmittance Amplifiers (OTAs) with optional bias control circuitry along with improved input and output buffers.

Referring now to FIG. 1A, a general embodiment of a fiber optic communication system 100 is shown. In the fiber optic communication system 100, a first system 110 is optically coupled to a second system 120 by means of optical communication channels $130_1$-$130_N$ (where $N \geq 1$). Each optical communication channel $130_1$-$130_N$ may be bi-directional, and if so, includes a first fiber optic communication link 132 and a second fiber optic communication link 134. If only unidirectional communications are desired, one of the first or second fiber optic communication links 132 or 134 can suffice for the communication channel depending upon the desired direction of the data transfer. Each fiber optic communication link 132 and 134 represents one or more fiber optic cables.

Wavelength division multiplexing (WDM) may be used over each of the fiber optic communication links to accommodate multiple channels of communications over a fiber optic cable. Bi-directional communication may also be provided over one fiber optic communication link 132 or 134 by using different wavelengths of light within the same fiber optic cable.

First system 110 comprises one or more fiber-optic transceiver modules $140_1$-$140_N$. Similarly, second system 120 includes one or more fiber-optic transceiver modules $150_1$-$150_N$. Each of the fiber-optic transceiver modules $140_1$-$140_N$ and $150_1$-$150_N$ include a transmitter (TX) 160 and/or receiver (RX) 170 in order to provided bi-directional communication. If unidirectional communication is desirable, a transmitter TX 160 may be placed within first system 110 while a receiver RX 170 would be placed at second system 120 instead of deployment of a transceiver at both systems 110 and 120.

Photons or light signals (e.g., data) are generated by transmitter TX 160 in the first system 110; transmitted through the fiber optic cable associated with link 132; and received by receiver RX 170 of the second system 120. On the other hand, transmitter TX 160 of the second system 120 can generate photons or light signals (e.g., data) and transmit them through the fiber optic cable of the link 134 which can then be received by the receiver RX 170 of first system 110. Thus, communication system 100 can utilize photons or light signals to bi-directionally communicate data through the fiber optic cables and the respective links between first system 110 and second system 120.

Referring now to FIG. 1B, a more detailed embodiment of the fiber optic communication system 100 is shown. Herein, fiber optic communication system 100 is a long haul fiber optic communications channel with one or more repeaters $180_1$-$180_M$ ($M \geq 1$) between the ends of the communications channel. While such communications involve a unidirectional channel from a transmitter 160 to a targeted receiver 170, of course, it is contemplated that fiber optic communication system 100 can be readily expanded to support bi-directional communications.

From a first transmitter 160 to first repeater $180_1$ is a first fiber optic cable 190. Between repeaters $180_1$-$180_M$ are fiber optic cables $192_1$-$192_{M-1}$. Between the last repeater $180_M$ and the last receiver 170 is another fiber optic cable 194. The lengths of the fiber optic cable 190, fiber optic cables $192_1$-$192_{M-1}$, and fiber optic cable 194 are typically as large as possible in order to reduce the number of repeaters $180_1$-$180_M$.

Each repeater $180_1$-$180_M$ includes at least one receiver electrically coupled to a transmitter. In one embodiment, however, each repeater $180_1$-$180_M$ may include one or more transceivers.

FIG. 2 illustrates a perspective embodiment of first system 110. As shown, first system 110 comprises a plurality of fiber-optic subsystems 200 (e.g., optical routers, bridges, or any optical transmitting and/or receiving components) that are positioned in close proximity to each other. For instance, as an illustrative example, a number of fiber-optic subsystems 200 may be positioned on a rack 210 and coupled to fiber optic cables 220 that interconnect first system 110 with other systems in different geographic areas. Each of the fiber-optic subsystems 200 comprises at least one fiber-optic module 300 operating as either (i) a transceiver (e.g., transceiver module $140_1$), (ii) a transmitter, or (iii) a receiver.

Figure 3:
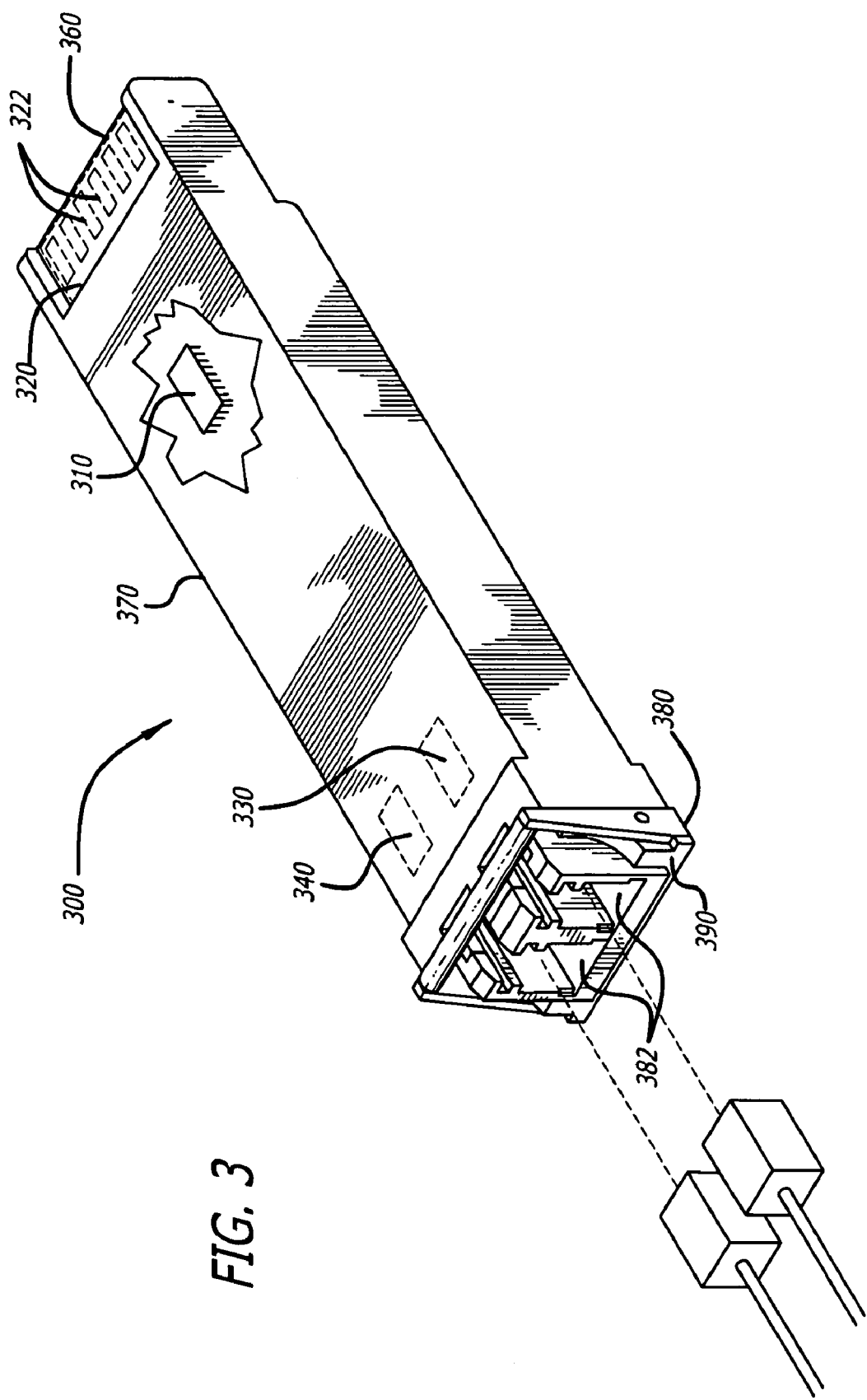
FIG. 3 is an exemplary block diagram of a fiber-optic transceiver module.

Referring now to FIG. 3, an exemplary of a fiber-optic module 300 is illustrated. As shown, fiber-optic module 300 includes an integrated circuit 310 mounted therein to a printed circuit board 320 that incorporates embodiments of the invention. As discussed previously, integrated circuit 310 may be one or more application specific integrated circuits (ASICs) to support the electronics of transmitter and/or receiver. Fiber-optic module 300 further includes a light transmitter 330 (e.g., an electrical-to-optical "EO" converter) and a light receiver 340 (e.g., an optical-to-electrical "OE" converter). Fiber-optic module 300 may be compatible with the 10 gigabit per second (10 GPS) small form-factor pluggable multi-source agreement (XFP), the three hundred pin multi-source agreement (MSA), XPAK, X2, XENPAC and other proprietary or standard packages.

Printed circuit board 320 includes top and bottom pads (top pads 322 illustrated) to form an edge connector 360 to couple to a socket of a host printed circuit board (not shown). A housing 370 is positioned around printed circuit board 320 to protect and shield integrated circuit 310. A front fiber optic plug receptacle 380 is provided with openings 382 to interface with one or more fiber optic cables and their plugs. A mechanical latch/release mechanism 390 may be provided as part of the fiber-optic module 300. While fiber-optic module 300 has been described has having both light transmission and light reception capability, it may be a fiber optic transmitter module with light transmission only or a fiber optic receiver module with light reception only.

Figure 4:
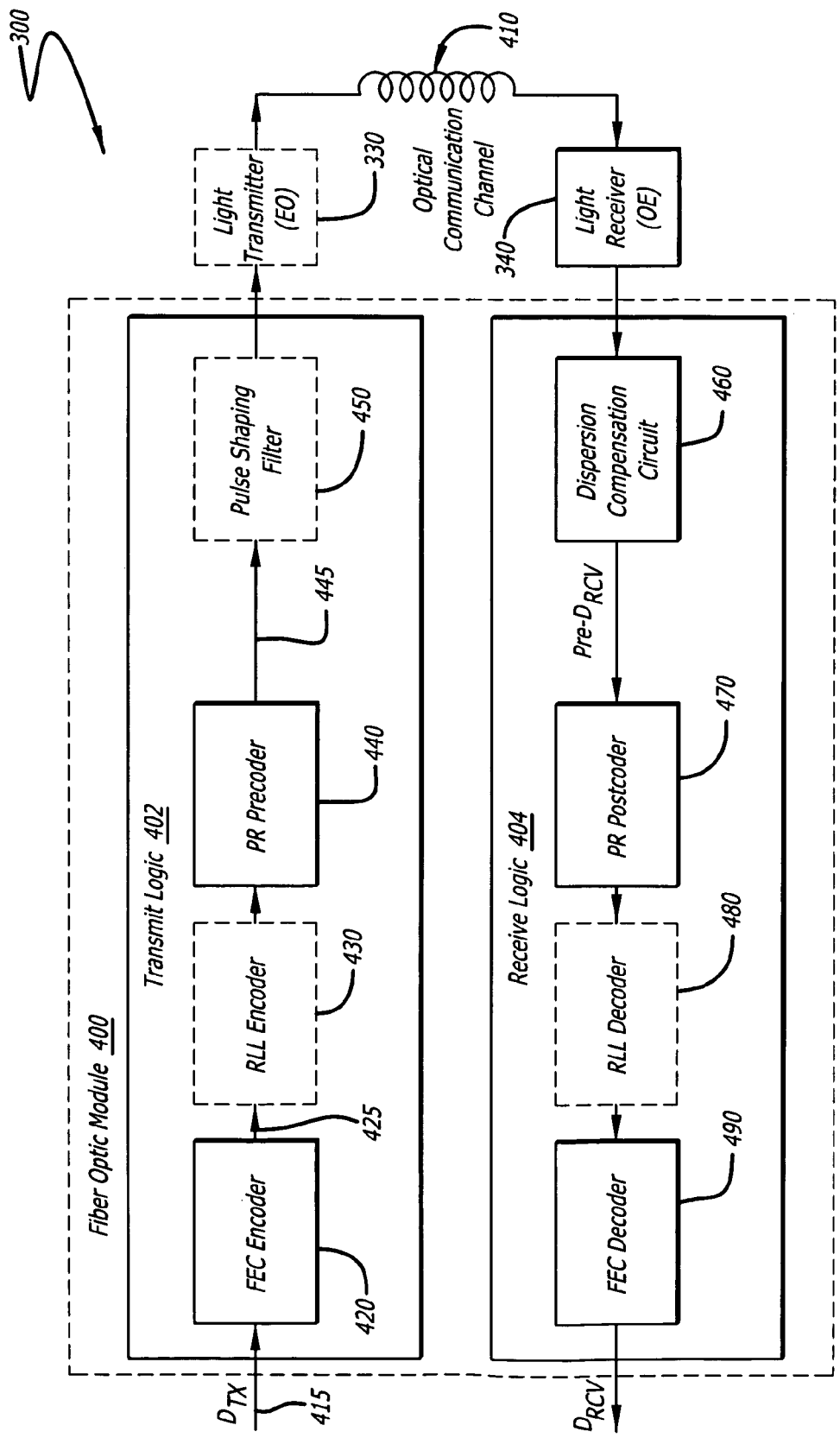
FIG. 4 illustrates an embodiment of a high level block diagram illustrative of electrical elements within the fiber-optic transceiver module of a fiber-optic subsystem of FIG. 2.

FIG. 4 illustrates an embodiment of a high level block diagram illustrative of electrical elements within fiber-optic transceiver module 300 of fiber-optic subsystem 200. Fiber-optic transceiver module 300 comprises a fiber-optic module 400 that is coupled to an optical communication channel 410. More specifically, fiber-optic module 400 comprises transmit logic 402 that is coupled to light transmitter 330 (e.g., an electrical-to-optical "EO" converter) and receive logic 404 that is coupled to a light receiver 340 (e.g., an optical-to-electrical "OE" converter). Both light transmitter 330 and light receiver 340 are coupled to optical communication channel 410.

More specifically, transmit logic 402 includes an error correction (FEC) encoder 420, an optional run-length limited (RLL) encoder 430, a partial response (PR) precoder 440, and a pulse-shaping filter 450 adapted to perform spread pulse coding (SPC) or spread-pulse modulation (hereinafter generally referred to as a "spread-pulse modulator 450"). FEC encoder 420 is adapted to receive transmit data (Dtx) 415 and to create redundant data for error correction at the targeted receiver. Thereafter, encoded data 425 may be provided to an optional run-length limited (RLL) encoder 430. If implemented, RLL encoder 430 operates at a code rate chosen based on given constraints of optical communication channel 410.

In the event that RLL encoder 430 is not provided, the encoded data 425 is routed to PR precoder 440. PR precoder 440 performs pre-coding operations on encoded data 425 in order to produce pre-code data 445 that prevents catastrophic error propagation at a targeted receiver. Precoder 440 recursively correlates a sequence of bits of the stream of encoded data 425 so that there is a dependency between the data bits of the precoded data 445 at the transmitter. That is, the data bits in precoded data stream 445 are correlated to each other. When received at the targeted receiver, the precoding deters errors propagation during decoding.

In one embodiment of the invention, precoder 440 may implement the equation $y(n)=x(n) \oplus y(n-2)$ for example, where "$y(n)$" is the output of precoder 440 for sample number n, "$x(n)$" is the data input to precoder 440 for sample number n, "$y(n-2)$" is the output of precoder 440 for sample number (n−2), and the symbol "$\oplus$" represents an exclusive-or (XOR) logical function. In another embodiment of the invention, precoder 440 may implement the equation $y(n)=x(n) \oplus y(n-1) \oplus y(n-2)$, for example. It is readily appreciated that other equations may be implemented to correlate bit sequences together at precoder 440, including using more orders as well as higher orders of correlation to correlate more bits and use an exclusive-nor logical function to perform the digital bit correlation in place of the exclusive-or logical function.

Precoded data 445 is output from precoder 440 to pulse-shaping filter 450. Pulse shaping filter 450 is designed to fit a suitable pulse response (e.g., Gaussian or raised cosine). Pulse-shaping filter 450 shapes the pulses of the precoded signal to spread out the pulses into a spread-pulse signal output that may be considered to perform spread pulse coding (SPC) or spread-pulse modulation (SPM). By spreading out the pulses in the spread-pulse signal, less distortion may be added by optical communication channel 410 (e.g., the channel response H(w)) during transmission. The pulse shape remains nearly unchanged during the transmission over optical communication channel 410. By spreading out the pulses in the time-domain, (reducing the spread of pulses in the frequency domain), the bandwidth of the original signal is reduced, the dispersion length ($L_D=T_0^2/B_2$, where "$B_2$" is the dispersion factor of channel, and "$T_0$" is the initial pulse width) is increased significantly, and the dispersion effects of the optical fiber are thus substantially eliminated.

Additionally, spread pulse coding (i.e., pulse spreading or spreading out pulses) is immune to non-linear distortions caused by the Kerr effect such as self-phase and cross-phase modulation and in PM-AM conversion. This immunity to nonlinear effects allows for higher launch power, and therefore higher SNR at the receiver, without any significant loss in performance. Additionally the pulse spreading allows for an exact CTF design in the receiver that improves signal to noise ratios. Finally, due to its bandwidth-narrowing property, SPC (or SPM) allows for tighter WDM channel spacing.

For instance, according one embodiment of the invention, pulse-shaping filter 450 is an analog Bessel filter. In another embodiment of the invention, pulse-shaping filter 450 is an analog raised cosine filter. The parameters of the filters (e.g., order, bandwidth) are selected to minimize the bit-error rate at the receiver.

In implementation, pulse-shaping filter 450 may be implemented in the optical domain by using a dispersive element positioned after the electrical-to-optical (EO) element 330 in one embodiment of the invention. In another embodiment of the invention, pulse-shaping filter 450 may be implemented in both the electrical domain and the optical domain. In another embodiment of the invention, the function of pulse-shaping filter 450 is integrated within the EO element 330. In yet another embodiment of the invention, pulse-shaping filter 450 may be unused and omitted.

According to this illustrative embodiment of the invention, the signal output from pulse-shaping filter 450, an electrical signal, is coupled into the electrical-to-optical (EO) converter 330. EO converter 330 is typically a semiconductor laser with a semiconductor laser driver (direct modulation) or external modulator. The spread pulse signal is used to modulate the laser output of the semiconductor laser (e.g., EO converter 330) in order to transmit data over the optical channel. Basically, EO converter 330 converts the spread-pulse signal from an electrical signal in the electrical domain into an optical or light signal in the optical domain.

Coupled to the optical fiber of optical communication channel 410, EO converter 330 transmits the spread-pulse signal over the optical fiber from transmit logic 402 to the targeted receiver. The optical or light signal of the transmitted spread-pulse signal experiences the channel response H(w) over the optical communication channel 410.

Similarly, receive logic 404 includes a dispersion compensation circuit 460 that is coupled to light receiver 340, a partial response (PR) postcoder 470, an optional run-length limited (RLL) decoder 480 and an FEC decoder 490. Dispersion compensation circuit 460 is described in FIG. 5 and is used to compensate for the dispersion effects caused by optical communication channel 410.

Figure 5:
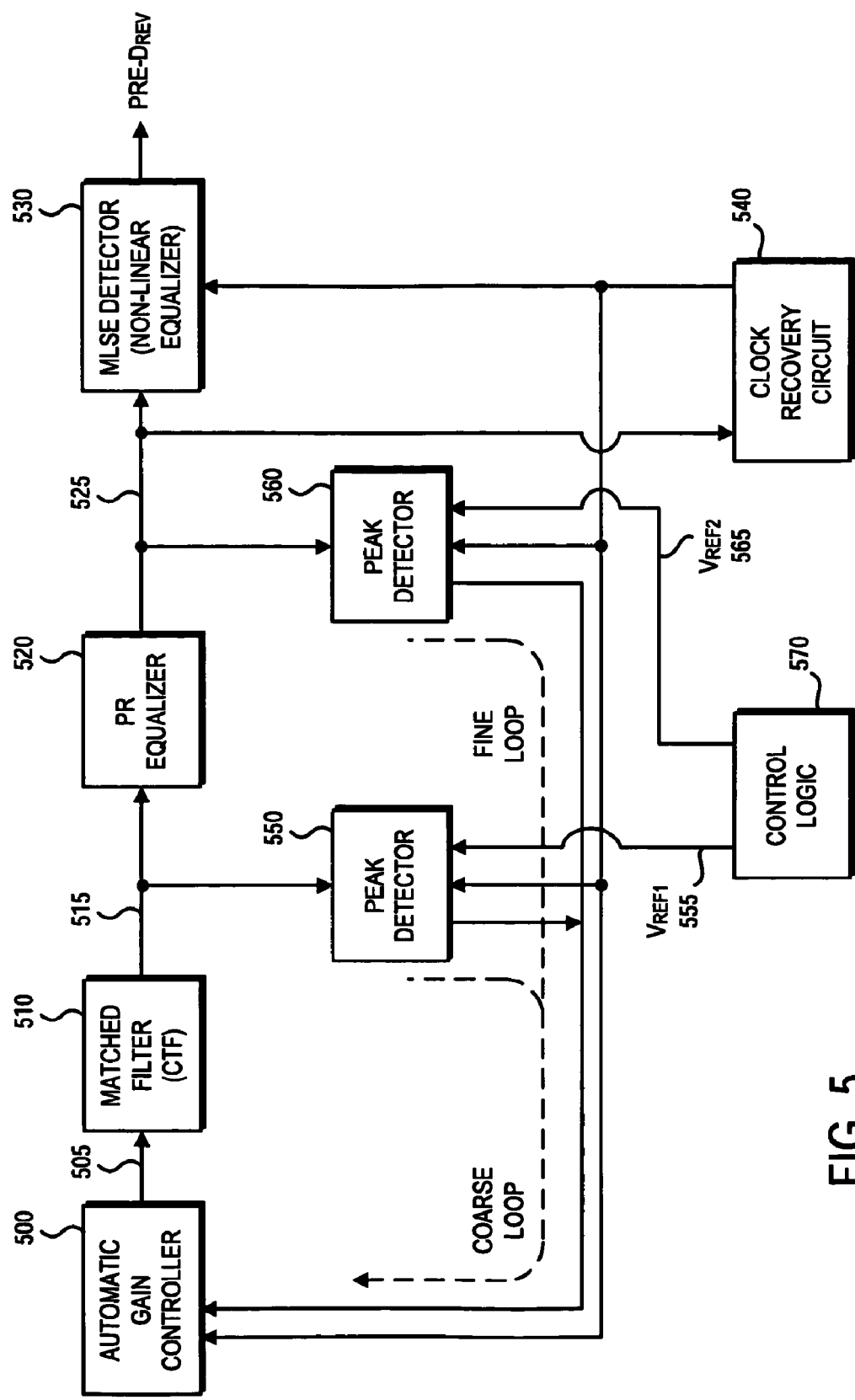
FIG. 5 illustrates an embodiment of a dispersion compensation circuit implemented within the fiber-optic transceiver module of FIGS. 3 and 4.

More specifically, according to one embodiment of the invention as shown in FIG. 5, dispersion compensation circuit 460 comprises an automatic gain control (AGC) 500, a filter 510 that includes a continuous time filter (referred to as "CTF" or "CT filter"), a partial response (PR) equalizer 520, a maximum likelihood sequence estimation (MLSE) detector 530, a clock recovery circuit 540 and various peak detectors 550 and 560 controlled by logic 570 in order to provide refined feedback to the AGC 500.

The AGC provides gain for low amplitude signals and attenuation for high amplitude signals to limit or maintain the signal within a known range of amplitudes and keep the power level in the signal somewhat constant. This automatic gain control enhances linearity in the system by reducing distortion and preventing saturation.

Gain-controlled signal 505 output from the AGC 500 is coupled into filter 510. Filter 510 may be implemented either as a digital filter or an analog filter. Filter 510 is designed to have a response that closely matches the combined transmitter/channel response H(w) so as to optimize the signal-to-noise ratio in the presence of noise. Filter 510 increases the signal-to-noise ratio of the receiver by filtering the received spread-pulse signal using CT filter 510.

A CT filter typically has a response which maximizes the signal-to-noise ratio in the presence of white noise. To optimize the performance of dispersion compensation circuit 460, knowledge of the channel transfer function is helpful. The optical channel is treated as being weakly non-linear. The linear effects of the optical channel, such as dispersion and loss, dominate in the early part of a pulses journey down the optical channel. The channel non-linearities are included after the pulse disperses. Filter 510 is designed to fit a newly found transfer function that accurately describes the envelope of the fiber optic channel. In one embodiment of the invention, filter 510 is an analog filter that is matched to pulse-spreading filter 450. In which case, the transfer function used to describe the envelope of the fiber optic channel is a time domain linear solution given by equation of A(z,t) below where the square of the pulse width is much less than $B_2z$.

$$A(z, t) \approx \frac{\tilde{A}\left(0, \frac{t'}{B_2z}\right)}{\sqrt{2\pi B_2z}} \exp\left(-i\frac{t^2}{2B_2z}\right)$$

where $T_0^2$ is much less than $B_2z$.

A(z,t) is the pulse response at a distance z away from the transmitter within the channel (e.g., the fiber) at a time t. $\tilde{A}(0, t/B_2z)$ is the Fourier transform of A(0, t), the initial pulse at the transmitter (i.e., z=0) evaluated at the frequency f equal to $t/B_2z$. Filter 510 solves the dispersion problem in the channel (e.g., the fiber) ignoring non-linear problems. Using this response equation, filter 510 can be simple, requiring no integration. Filter 510 is programmable based on channel properties such as distance z, dispersion factor of channel (e.g., the fiber) $B_2$, and initial pulse width $T_0$.

A voltage level of the output of filter 510, namely the voltage of a received spread-pulse signal 515, is compared with a selected voltage reference ($V_{REF1}$) 555 by peak detector 550. Such comparison is performed in order to maintain the voltage level for spread-pulse signal 515 and compensate for non-linearity effects by filter 510.

The output of filter 510 also is coupled into the input of a partial response (PR) equalizer 520. According to one embodiment of the invention, PR equalizer 520 is an adaptive filter that can be implemented as either an analog filter, a digital filter, or a combination thereof. In general, PR equalizer 520 shapes the spectrum of spread-pulse signal 515 into that of a desired partial-response signal. That is PR equalizer 520 shapes received spread-pulse signal 515 into a desired target response 525, the partial-response signal, in order to reduce distortion by equalizing the linear distortion that may have been introduced by the channel. Since, PR equalizer 520 is implemented as a FIR filter, it may be referred to as a linear equalizer.

A peak detector 560 compares a voltage level of the output of PR equalizer 520, namely the voltage of partial-response signal 525, with another selected voltage reference ($V_{REF2}$) 565. This comparison is performed in order to maintain address non-linearity, which may cause deviations in the transfer coefficient by 1-2 decibels (dBs) or more.

Control logic 570 controls peak detectors 550 and 560 by turning on/off peak detectors in order to adjust AGC 500 as needed. The feedback established between peak detector 550 and AGC 500 is referred to as "coarse feedback" since greater adjustments are normally imposed while the feedback between peak detector 560 and AGC 500 is referred to as "fine feedback".

The output of PR equalizer 520 is also coupled into an input of clock recovery circuit 540. From the signal output of PR equalizer 520, clock recovery circuit 540 generates or recovers a clock signal to synchronize data recovery functions together. The clock signal is coupled to PR equalizer 520, the maximum likelihood sequence estimation (MLSE) detector 530, such as a Viterbi detector and AGC 500. As a result, the timing of PR equalizer 520, MLSE detector 530, AGC 500, partial response (PR) postcoder 470, an optional RLL decoder 480 and FEC decoder 490 may be synchronized together.

Referring back to FIG. 4, PR postcoder 470 performs the inverse function of the PR precoder 440. As discussed previously, precoder 440 recursively correlates a sequence of bits of the stream of RLL encoded data to avoid error propagation at the receiver. That is, a sequence of data bits in the precoded data stream are correlated to each other before transmission. Thus, in the receiver, PR postcoder 470 recursively de-correlates a predetermined sequence of bits in the MLSE data signal (corresponding to correlated RLL coded data). The number of predetermined sequence of bits being de-correlated in the receiver may match the number of the predetermined sequence of bits that were correlated in the transmitter. This removes the dependency between data bits in the data stream.

As described above, filter 510 may be adapted as a continuous time filter (CTF) 600 that may be interposed between an input buffer 610 and an output buffer 620. Herein, input buffer 610 features circuitry designed to translate any signal from the voltage domain into the current domain. Output buffer 620 features circuitry that is used to convert current to voltage and amplify the voltage to produce a necessary voltage level.

I. Continuous Time Filter

Figure 6:
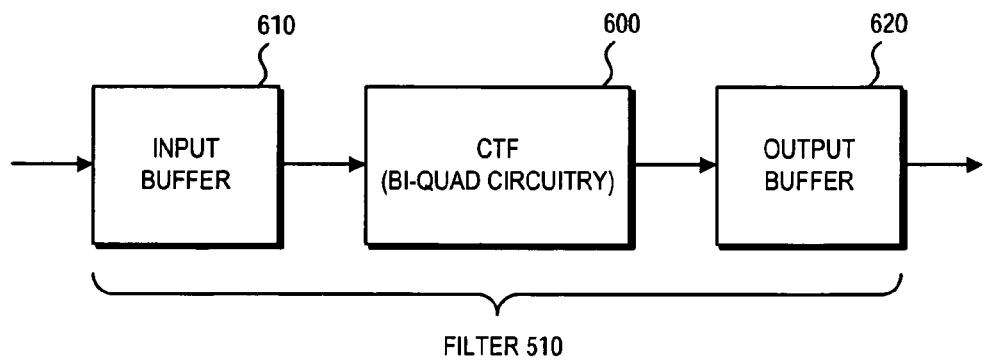
FIG. 6 illustrates an embodiment of a continuous time filter (CTF) interposed between an input buffer and an output buffer.
Figure 7:
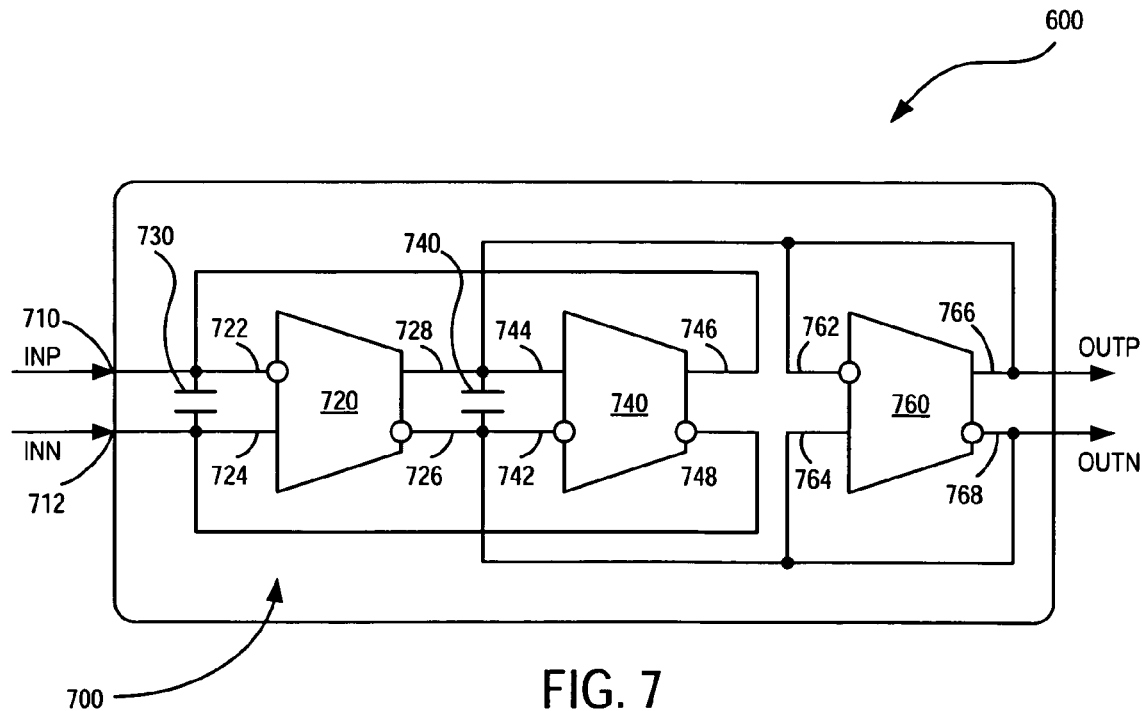
FIG. 7 illustrates an exemplary embodiment of a bi-quad circuit implemented within the CTF of FIG. 6, where the bi-quad circuit is based on differential operational trans-admittance amplifiers (OTAs).

More specifically, as shown, FIG. 7 illustrates an exemplary embodiment of CTF 600 of FIG. 6 where CTF 600 is implemented with a bi-quad circuit formed by a plurality of operational transconductance amplifiers (OTAS) 700, each OTA having differential input and output (hereinafter "differential OTAs"). The differential OTAs 700 provides high common mode rejection, and thus, suppresses coupling effects normally found in on-chip circuits.

Herein, as an illustrative example, CTF 600 comprises a plurality of differential OTAs 700, such as a first differential OTA 720, a second differential OTA 740 and a third differential OTA 760 for this illustrative embodiment. CTF 600 features a first input 710 that provides positive current to an inverting input 722 of a first differential OTA 720. CTF 600 also features a second input 712 that provides negative current to a direct input 724 of first differential OTA 720. Inputs 710 and 712 provide differential input for the filter.

As shown in this illustrative embodiment, first differential OTA 720 features a first (inverting) output 726 and a second output 728. First output 726 is coupled to a first (inverting) input 742 of second differential OTA 740 while second output 728 is coupled to second (direct) input 744. In addition, second differential OTA 740 comprises a first (direct) output 746 and a second (inverting) output 748. First output 746 is coupled to first input 722 of first differential OTA 720 for negative feedback and current biasing as described below. Second output 748 is coupled to second input 724 of first differential OTA 720 for negative feedback and biasing purposes.

Third differential OTA 760 features a first (inverting) input 762 and a second (direct) input 764. First input 762 is coupled to receive current supplied by second output 728 of first differential OTA 720 while second input 764 is coupled to receive current supplied by first (inverting) output 726. In addition, third differential OTA 760 comprises a first (direct) output 766 and a second (inverting) output 768 that operate as the differential output (OUTN, OUTP) for CTF 600. First output 766 is coupled to both first input 762 and second input 744 of second differential OTA 740 while second output 768 is coupled to both second input 764 and first input 742 of second differential OTA 740.

In order to provide bi-quad functionality, two capacitors are connected: first capacitor 730 is coupled to both first and second inputs 722 and 724 of first OTA 720 and a second capacitor 740 is coupled to first and second inputs 742 and 744 of second OTA 740.

Previously, CTFs employed CMOS transistors. Presently available CMOS technologies constrain filtering to megahertz ranges, and does not allow for filtering at gigahertz (GHz) ranges necessary for optical receivers and/or transceivers. Since the cutoff frequencies necessary for optical applications greatly exceed currently achievable limits for CMOS transconductance (gm) amplifiers, bipolar transistor based gm cells were developed as shown below. Simplest and fastest OTA implementation is based on a differential amplifier.

Figure 8A:
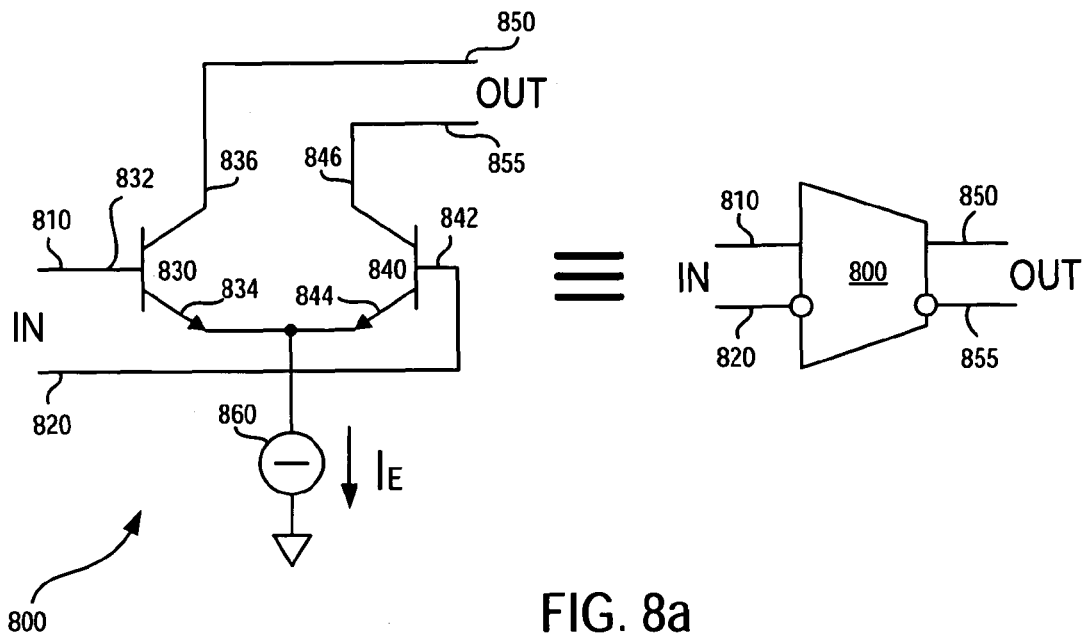
FIGS. 8A and 8B are exemplary embodiments of differential OTAs.
Figure 8B:
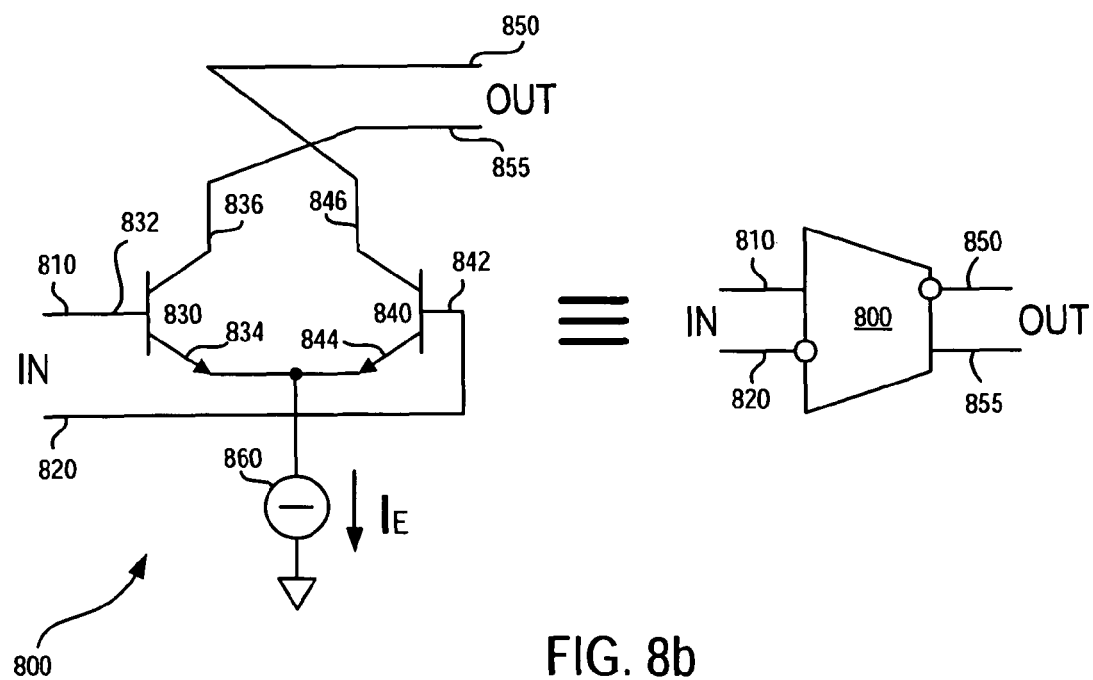

An illustrative example of a differential input/output OTA 800 that features both differential output and differential input is shown in FIG. 8A. Herein, differential OTA 800 includes a pair of inputs 810 and 820. A first input 810 is coupled to a base 832 of a first transistor 830 while a second input 820 is coupled to a base 842 of a second transistor 840. Emitters 834 and 844 of transistors 830 and 840 are commonly coupled to a sinking current source 860. Collectors 836 and 846 of transistors 830 and 840 are coupled to outputs (OUT) of differential OTA 800. Of course, in order to alter the location of the inverting (negative) and direct (positive) outputs 850 and 855 of differential OTA 800, these outputs may be coupled to different collectors. For instance, the inverting output could be coupled to collector 836 and direct output would be coupled to collector 846 as shown in FIG. 8B.

Referring now to FIG. 9A, an exemplary embodiment of a single-ended bi-quad circuit 900 is shown. This bi-quad circuit 900 comprises a plurality of single-ended OTAs (gm-cells) 900 interconnected together as shown. A first single-ended OTA 910 having an inverted input 922 and an output that is coupled to an input of a second single-ended OTA 920 and a third single-ended OTA 930 operating as feedback loops as shown. Herein, as shown in FIG. 9B, an inverting single-ended OTA (e.g., third single-ended OTA 930) includes an emitter 932, a collector 934 and a base 936. Emitter 932 is coupled to an output 940 while base 936 is coupled to an input 942. Collector 934 is coupled to receive a negative supply voltage (Vee) 944. A bias circuit 946 is coupled between base 936 and Vee 944 in order to adjust input 942 applied to base 936.

Figure 9C:
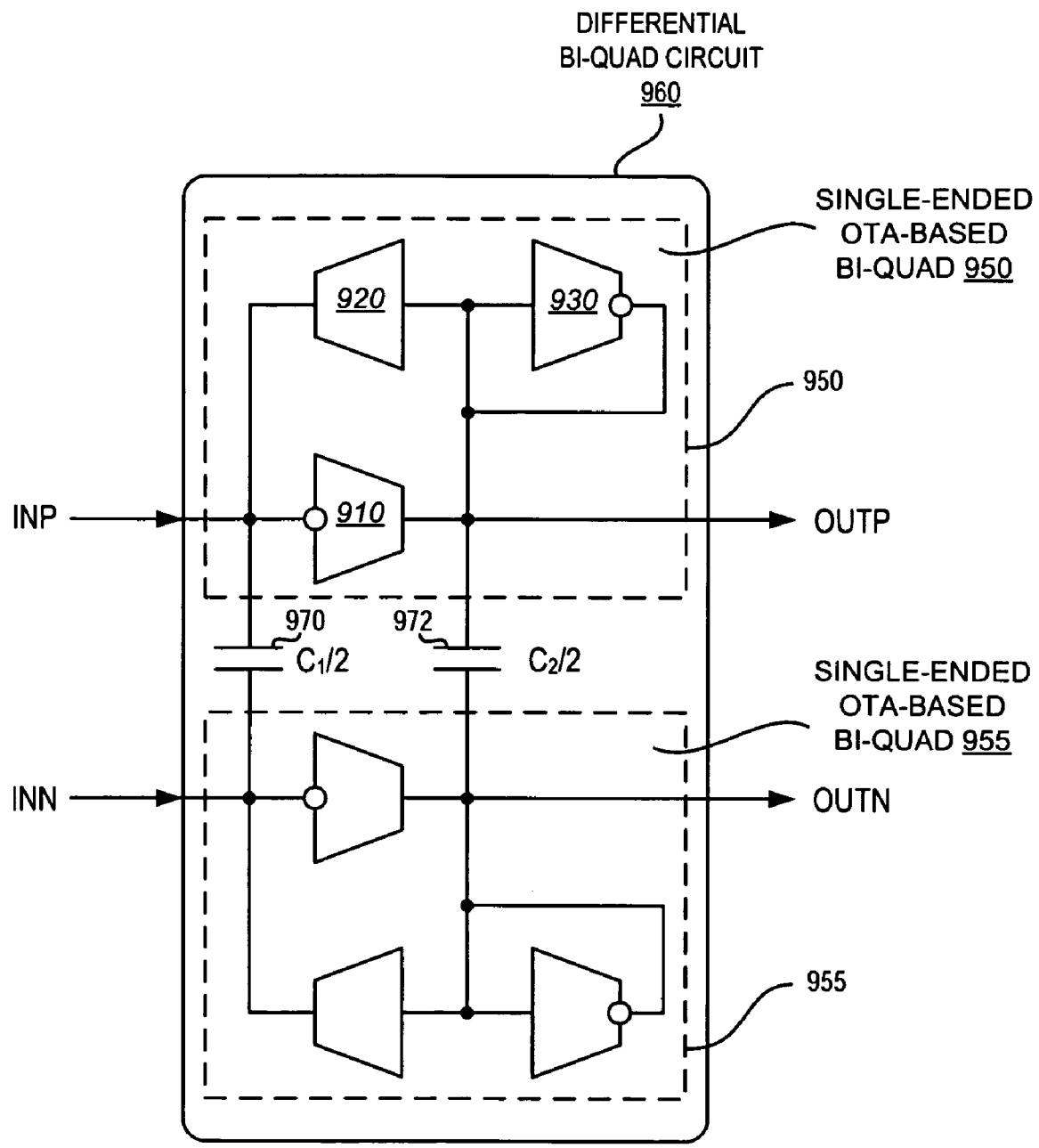
FIG. 9C is an exemplary embodiment of a differential bi-quad circuit formed by a combination of single-ended OTAs.

As shown in FIG. 9C, a combination of bi-quad circuits 950 and 955 based on OTAs yields a differential bi-quad circuit 960. In particular, differential bi-quad circuit 960 features a first single-ended, OTA-based bi-quad circuit 950 with a second single-ended, OTA-based bi-quad circuit 955 coupled in a mirrored effect to first single-ended bi-quad circuit 955. As shown, capacitors 970 and 972 having one-half the capacitance of the capacitors set forth in FIG. 9A. One inherent advantage that is offered by differential circuits is that the capacitance of the differential bi-quad circuit 960 is reduced by one-half when comparing its capacitance to the single-ended bi-quad circuit 900 of FIG. 9A. This reduction in capacitance allows for lesser on-chip area to be used.

Figure 10:
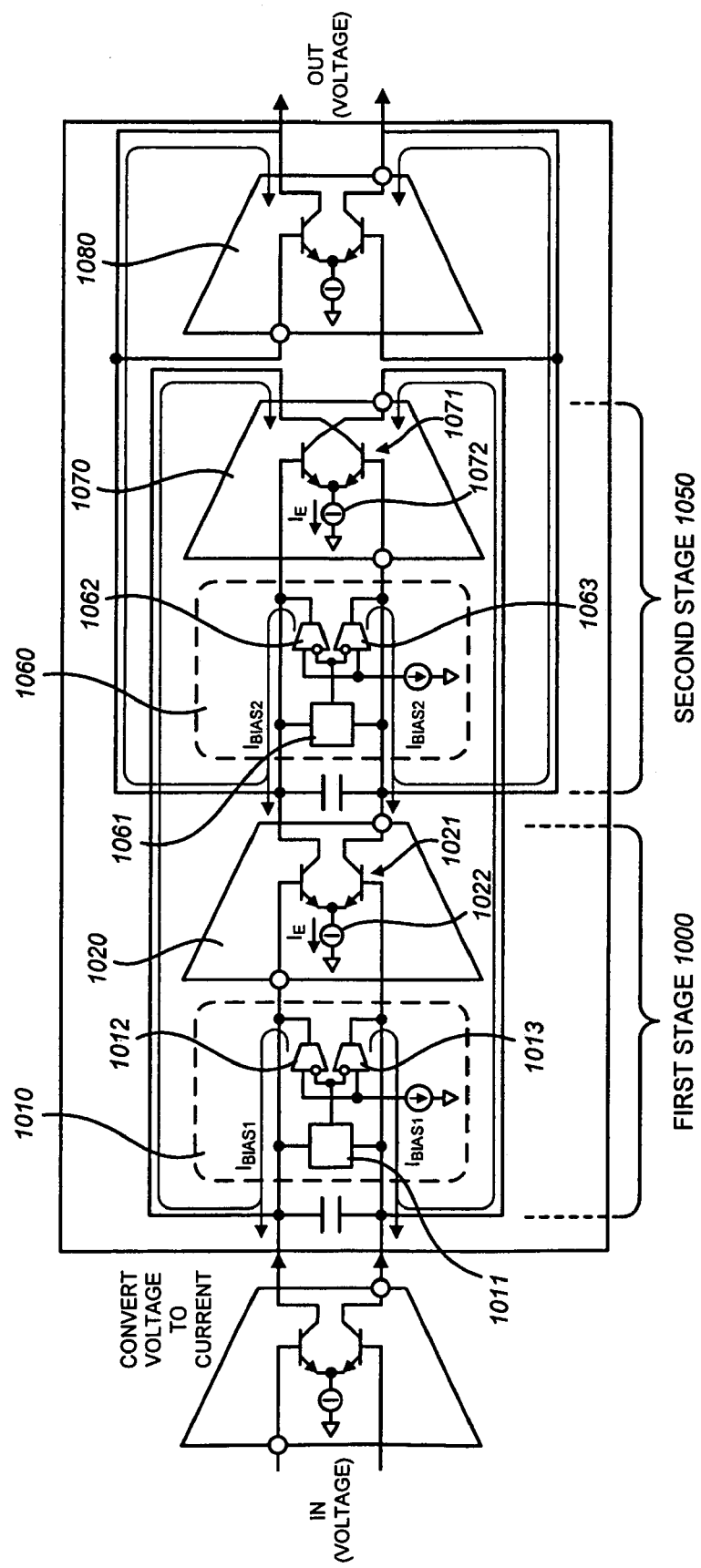
FIG. 10 is an exemplary embodiment of a differential bi-quad circuit implemented within the CTF of FIG. 6 where the differential bi-quad circuit features biasing circuitry to regulate the voltages on the collectors of the OTAs forming the bi-quad circuits.

Referring now to FIG. 10, an illustrative embodiment of an implementation of differential bi-quad circuit 960 is shown where the sourcing bias currents generated by the bias control circuits match the sinking biasing currents in the OTAs. Herein, differential bi-quad circuit 960 comprises a first stage 1000 and a second stage 1050. Coupled to a voltage-to-current converter, first stage 1000 includes a bias control circuit 1010 and a differential OTA 1020. Biasing control circuit 1010 provides proper biasing voltage for OTA 1020 by maintaining the average input voltage of OTA 1020 equal to the reference voltage. Second stage 1050 includes and a bias control circuit 1060 and a differential OTA 1070. Biasing circuit 1060 provides proper biasing voltage for OTA 1070 by maintaining the average input voltage of the OTA equal to the reference voltage.

The sourcing bias currents that are generated by bias control circuits 1010 and 1060 to match the sinking biasing currents in differential OTAs 1020 and 1070, respectively. In other words, to be properly biased, the sinking currents (see $I_E$) should be sourced. The amount of sourced current has to precisely match the sinking current ($I_E$). Otherwise, the voltages on OTA collectors would either move down or up radically, driving differential OTAs 1020 and 1070 out of the active region.

Herein, bias control circuit 1010 comprises a voltage average circuit 1011 formed as a voltage divider with an output operating as an input into inverted inputs of gm-cells 1012 and 1013. The direct inputs of gm-cells 1012 and 1013 are coupled to a voltage bias circuit which provides the reference voltage. Since the outputs of the gm-cells are fed back to the inverting inputs of the gm-cells 1012 and 1013 through the voltage average block 1011, the feedback loop maintains the inverting input of the gm-cells equal to the reference voltage which in turn is equal to the average voltage at the input of OTA.

Gm-cells 1012 and 1013 each comprise an output that is coupled to inputs of differential OTA 1020. A first (inverted) input of differential OTA 1020 is coupled to an output of gm-cell 1012. A second (direct) input of differential OTA 1020 is coupled to an output of gm-cell 1013.

Differential OTA 1020 features an amplifier 1021 with its tail current provided by sinking current source 1022. Differential OTA 1020 includes a first (direct) output and a second (inverted) output that are coupled to a voltage divider 1061 of second bias control circuit 1060 within second stage 1050.

As shown, second stage 1050 is configured similarly as first stage 1000. However, collectors of differential OTA 1070 are arranged so that both the second input and output of differential OTA 1070 are inverted to have negative feedback when the OTA 1070 outputs are connected to the inputs of OTA 1020. Second stage 1050 is coupled to OTA 1080 that handles current-to-voltage conversation.

According to this embodiment, the voltage averages on the OTA collectors are calculated and applied to the inverting inputs of gm-cells 1012/1013 and 1062/1063. Bias voltages matching the optimum voltage on the OTA transistor collectors are applied to the direct inputs of gm-cells 1012/1013 and 1062/1063. The feedback regulates the currents in the way that the average bias voltage would match desired bias voltage (applied to the direct inputs of gm-cells 1012/1013 and 1062/1063). Thus the collector voltages of OTA transistors would be set at optimal points for operation speed and linearity—out of saturation region.

The circuit as shown in FIG. 10 maintains collector voltages that match the base voltages. However, little headroom is remaining for OTA operations. In order to increase headroom and the dynamic range, base voltage levels should be maintained at a lower level. Bases of the OTAs should be shifted lower with respect to the collectors of driving OTAs as it is shown in FIG. 11.

Figure 11:
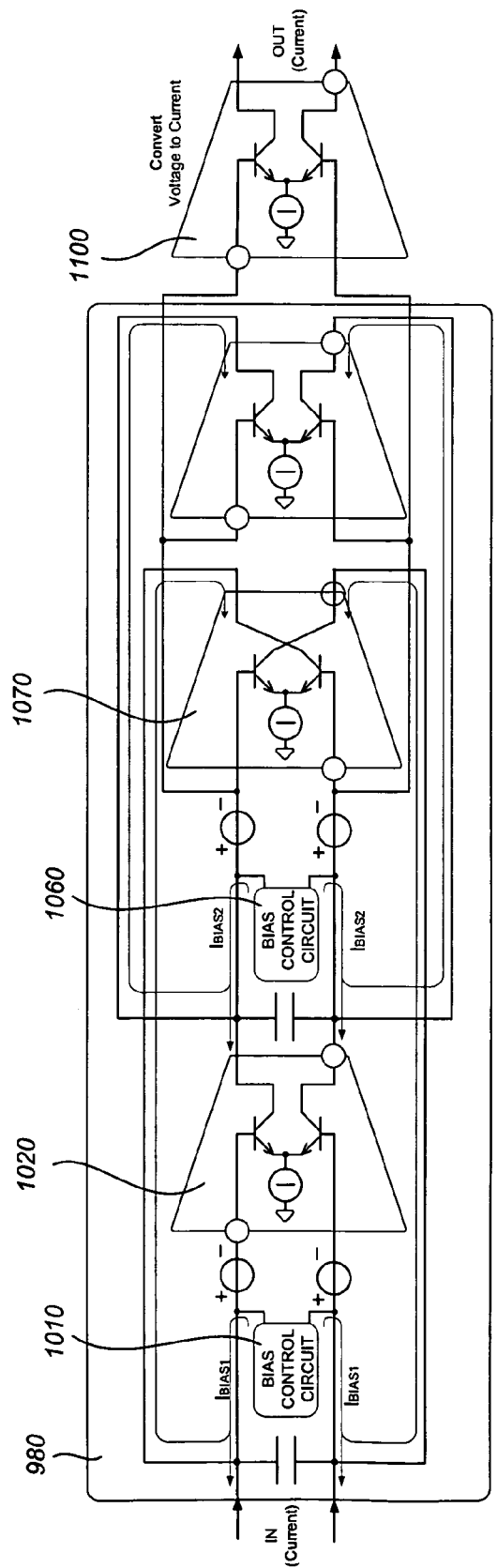
FIG. 11 illustrates an exemplary embodiment of a differential bi-quad circuit implemented within the CTF of FIG. 6 where the differential bi-quad circuit features introduces voltage offset to the bases of the OTA transistors to increase headroom and the dynamic voltage range.

As shown in FIG. 11, voltage-to-current converter OTA base voltage shift should match the preceding OTA shift. For cascading convenience the voltage to current converting OTA 1100 is moved to the output of bi-quad circuit 960. In this case, it shares the voltage shift with the bi-quad OTA. When base voltage is shifted down with respect to the collector voltage, collector voltage changing range is increased by the amount of the voltage shift introduced. In addition, higher collector voltage with respect to base voltage causes the collector-base junction capacitance to decrease making the circuit faster.

Figure 12:
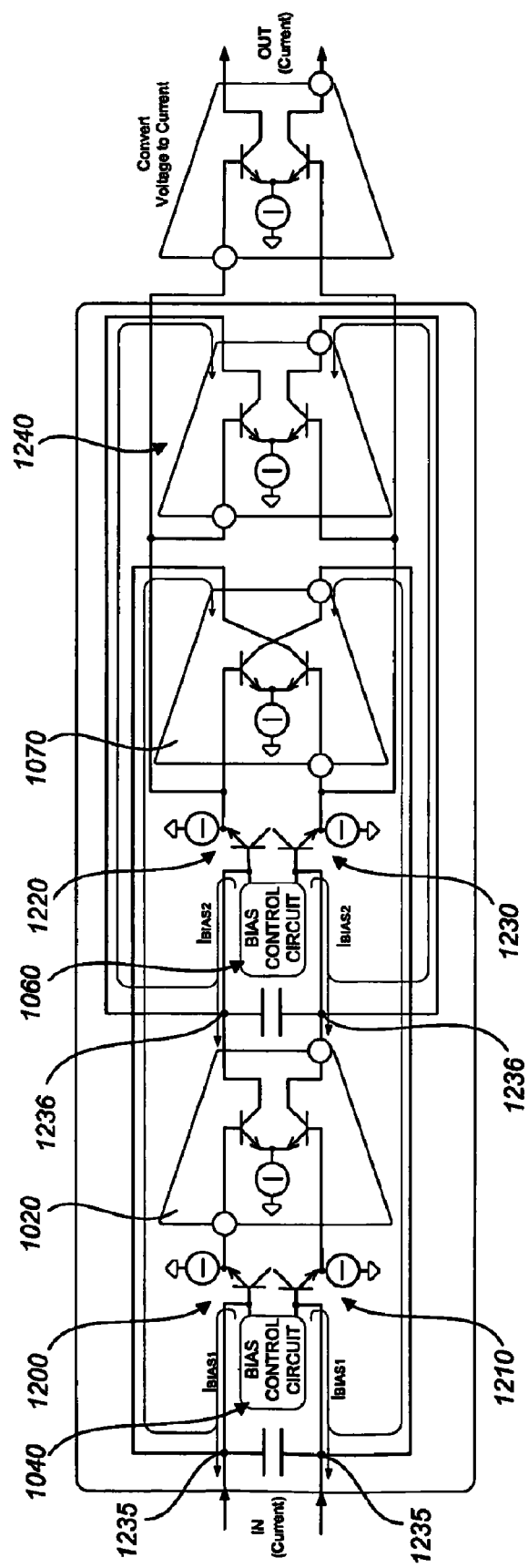
FIG. 12 illustrates an exemplary embodiment of of a differential bi-quad circuit implemented within the CTF of FIG. 6 where the differential bi-quad circuit features emitter followers used to generate the voltage shift.

As an alternative embodiment, emitter followers may be used for voltage shifting. The additional emitter followers 1200, 1210, 1220 and 1230 are shown in FIG. 12. As a result of this component modification, the voltage dynamic range of bi-quad circuit 960 is increased by $V_{BE}$, namely a base-to-emitter voltage of the emitter followers. Since output impedance of the emitter followers 1200, 1210, 1220 and 1230 is generally equivalent to $R_O \approx 1/g_m$, this circuitry also provides good isolation of the parasitic loading of OTAs 1020 and 1070 connected to the capacitor nodes 1235 and 1236. In order to accommodate the combination of sinking currents to node 1235 (input to the block and OTA 1070), sourcing current Ibias1 is produced by bias control circuit 1010. Similarly Ibias2 is produced by bias control circuit 1060 to accommodate the sinking currents of OTA 1020 and OTA 1240.

Figure 13:
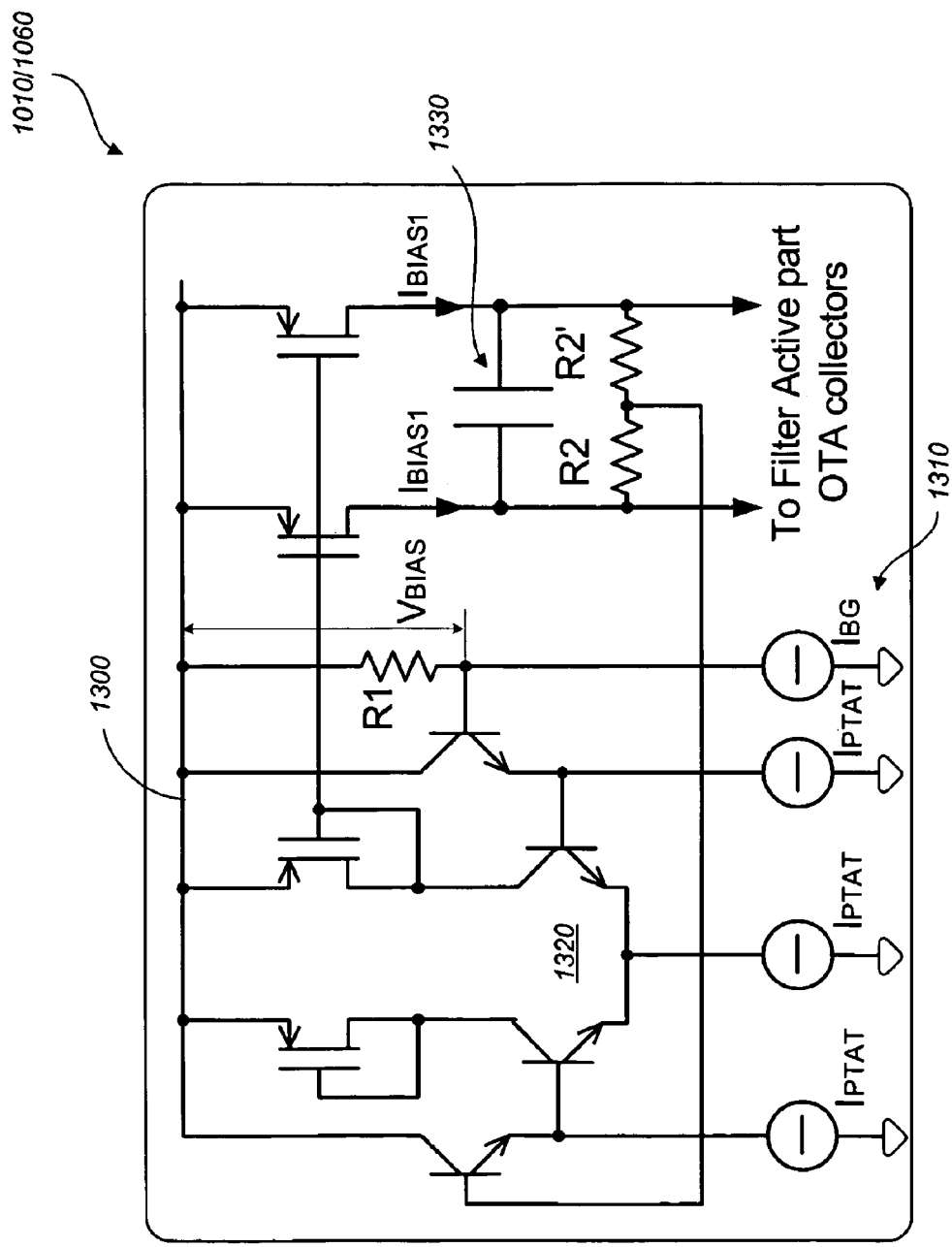
FIG. 13 illustrates an exemplary embodiment of a bias control circuit of FIGS. 10-12.

Referring back to FIG. 10, bias control circuits 1010/1060 provide the biasing currents for OTAs 1020, 1070 and 1080 and also ensure there is enough of headroom for OTA operation. One embodiment of bias control circuit 1010 is shown in FIG. 13. Band-Gap current source is producing $V_{BIAS}$ voltage with respect to upper power supply rail 1300. This helps in reducing of power supply variation impact and achieves better power supply rejection ratio (PSRR) since power supply variation impact would be damped by the high output impedance of a tail current source 1310. Any residual current variation appears as common mode variation for differential amplifier 1320 and only slightly modulates its gain.

If the gain is sufficiently high, gain variation does not have any impact on the setting of the bias current. Since OTAs have tail current sources, a high-impedance isolation from ground, their voltages follow upper power supply rail 1300. So, there is virtually no voltage modulation on the circuit nodes. The bias voltage Vbias is buffered by an emitter follower and is applied to one input of OTA 1320. The output average voltage produced by R2 and R2' is buffered by another emitter follower and is applied to the other input of OTA 1320. If the output voltage increases for any reason with respect to Vbias, the current Ibias1 will decrease causing the output voltage decreasing. So, negative feedback loop is maintaining the average output voltage equal to Vbias. Differential output voltage caused by the presence of differential signal would not change the average voltage and would cause no reaction of the bias circuit. So, the outputs of the block feature low impedance (feedback is suppressing any voltage change→low impedance) for the common mode signals and high impedance for the differential signals (defined by only the resistors R2, R2' that can be very high and dynamic resistances of the PMOS drains and collectors of the OTA transistors connected to the nodes).

Filter tuning can be realized based on tuning either transconductance ($g_m$) or capacitance (C) or both. The alteration of $g_m$ besides cut-off frequency changing introduces an unwanted change of biasing currents and/or an unwanted change in circuit dynamics. Therefore, capacitance changing is a more attractive option.

There are several ways capacitance can be varied. One embodiment involves the use of programmable metal-insulator-metal (MIM) capacitors controlled by CMOS switches. This method offers good stability over temperature and capacitance independent on the voltage. Of course, the disadvantage is ±15% capacitance variation over process corners. Another disadvantage is the fact that because of the non-idealities, finite resistance in OFF state in combination with the capacitance produces unwanted poles at low frequencies. This introduces unwanted poles at low frequencies and unwanted group delay variations over frequency. Increasing switch resistance in OFF state results in increased resistance in ON state introducing poles at high frequencies.

Another embodiment of the invention, as shown in FIG. 13, involves the use of a junction varactor or a CMOS-based varactor 1330. Besides relatively large capacitance variation over process corners (±15 . . . 20%), varactor capacitance in the active region also depends on temperature and applied signal biasing voltage as well as amplitude. However, the above-identified disadvantages of CMOS varactors can be eliminated by using fixed biasing voltage.

Figure 14:
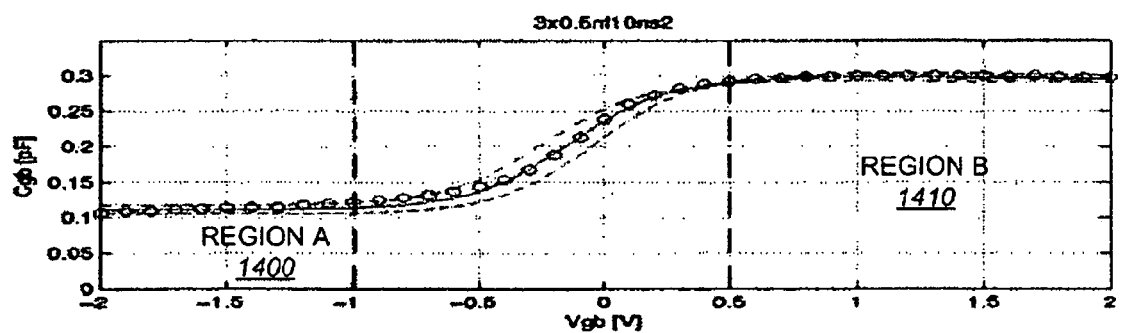
FIG. 14 illustrates an exemplary embodiment of varactor capacitance dependency over process corners.

As can be seen in FIG. 14, if voltage is set below −1 volt (V) as shown in region A 1400, the varactor is in low capacitance state. If the voltage is above 0.5V as shown in region B 1410, the varactor is in high capacitance state. Both states feature very small capacitance variation over process corners.

Figure 15:
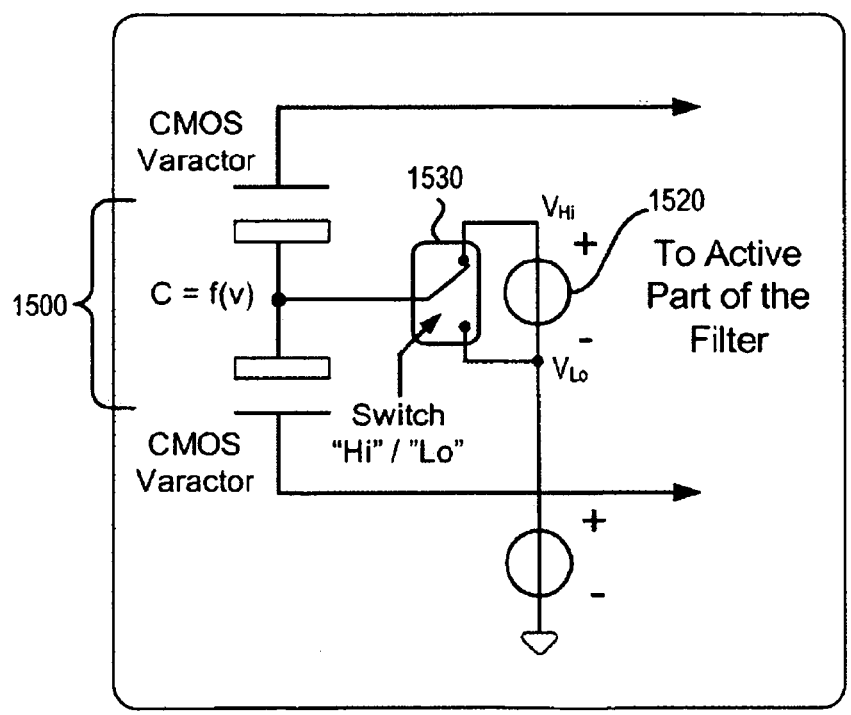
FIG. 15 illustrates a first exemplary embodiment of a tunable CMOS base varactor as shown in FIG. 13.

Referring now to FIG. 15, an exemplary embodiment of capacitance tuning based on one or more CMOS varactors (e.g., CMOS varactors 1500 and 1510) is shown. Herein, the capacitance of each CMOS varactor 1500 and 1510 is a function of the voltage. The low voltage on varactors 1500 and 1510 is set to $V_{LO}$ using a voltage source 1520 with respect to ground and it is set to $V_{HI}$ which is produced by adding an additional voltage with respect to $V_{LO}$. A switch 1530 allows selecting either $V_{HI}$ or $V_{LO}$ to be applied to the back side of varactors 1500 and 1510. The voltage on the active part of the resultant filter that sets the varactor gate voltages has to be in between of the voltages $V_{HI}$ and $V_{LO}$. Thus the capacitance of varactors 1500 and 1510 can be changed according to FIG. 14.

Figure 16:
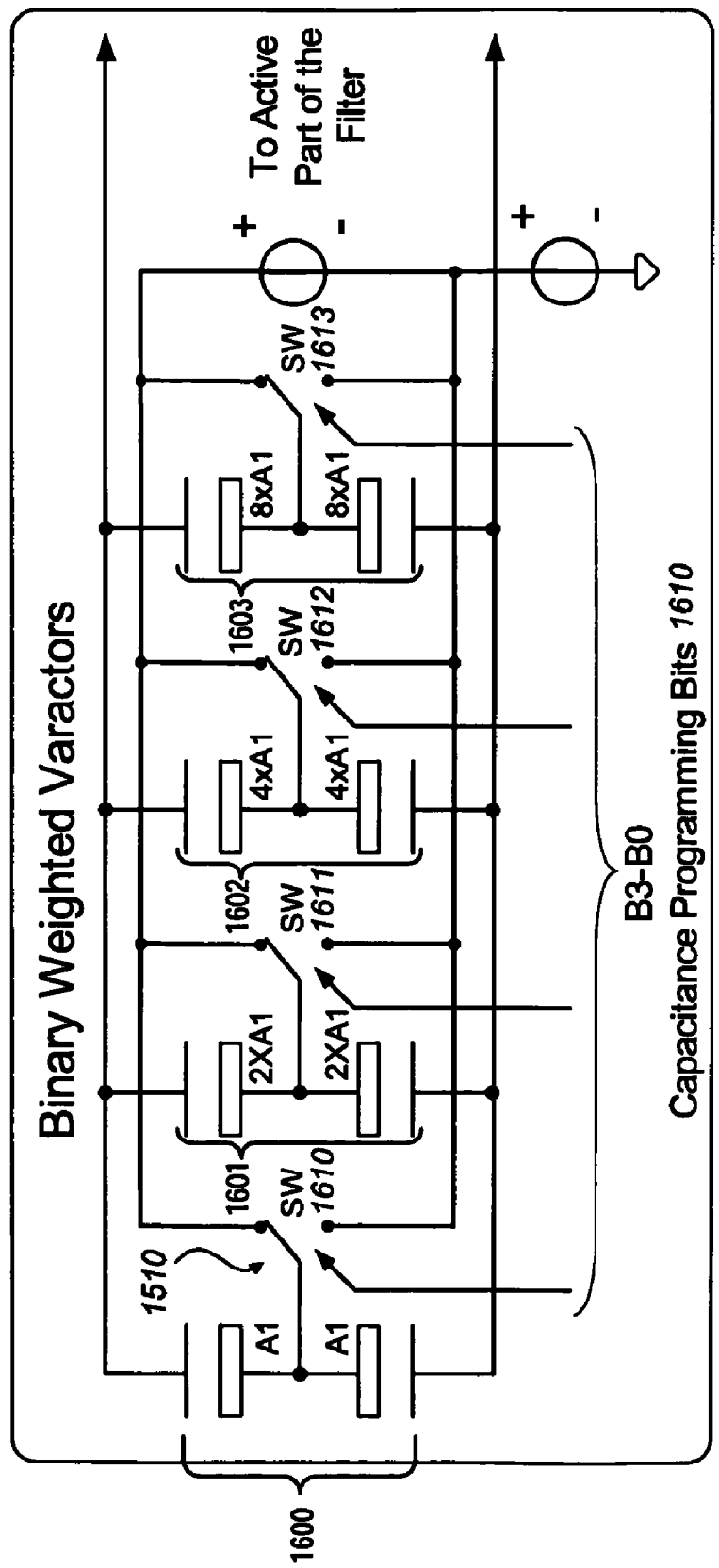
FIG. 16 illustrates an exemplary embodiment of a CMOS base varactor utilizing binary weighted capacitance tuning as shown in FIG. 13.

Tuning of the cut-off frequency of the resultant filter can be implemented by making use of binary programmed capacitance as shown in FIG. 16. Varactor capacitance is changed by switching the position of control switches (SW) 1610-1613 to apply either high or low voltages to varactors 1600-1603. Herein, programming bits (B3-B0) 1610 are set to control switches 1610-1613, respectively. The sizes of varactors 1600-1603 are set incrementally such as as 1:2:4:8 or perhaps another sequential or non-sequential ordering. Using binary code from programming bits 1610 allows to select any capacitance according to following equation: CL+dC*N, where "CL" is the total capacitance of the varactors when the capacitance of all varactors is tuned low; "dC" is the smallest varactor capacitance change when the tuning voltage changes in the way varactor is switched from low capacitance to high capacitance and "N" is the decimal value (1-15 in this embodiment) of the binary code. This arrangement allows tuning of the capacitance between CL to CL+dC*15 with the capacitance step equal to dC. Digital tuning is preferred since no digital-to-analog converter (DAC) is needed.

Figure 17:
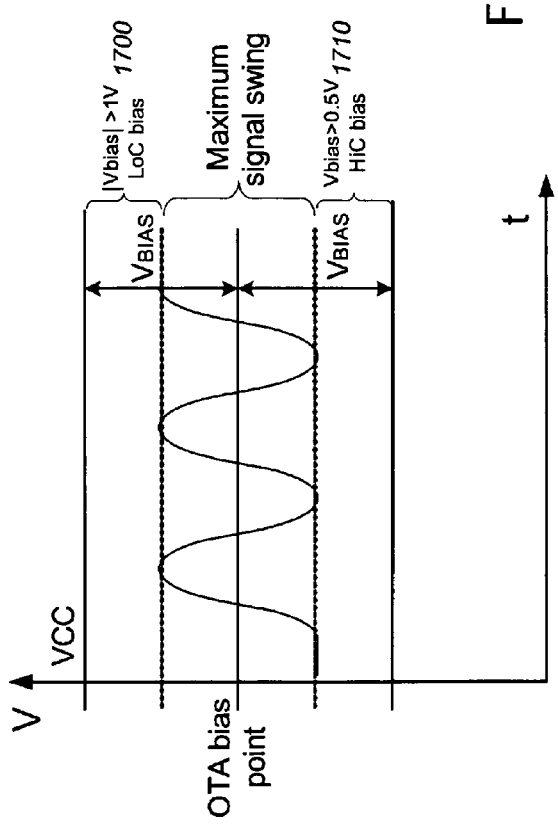
FIG. 17 illustrates an exemplary embodiment of the OTA bias level voltage signaling.

Since the voltage is also modulated by the signal, in order varactor capacitance to remain constant, varactors should be biased in the way the modulating voltage wouldn't drive varactors out of $C_V(V_{gb})$ saturation regions. Since the signal appears between OTA bias voltage levels 1700 and 1710 as shown in FIG. 17, the best control accuracy would be achieved when the control voltages are defined with respect to OTA bias voltage.

Figure 18:
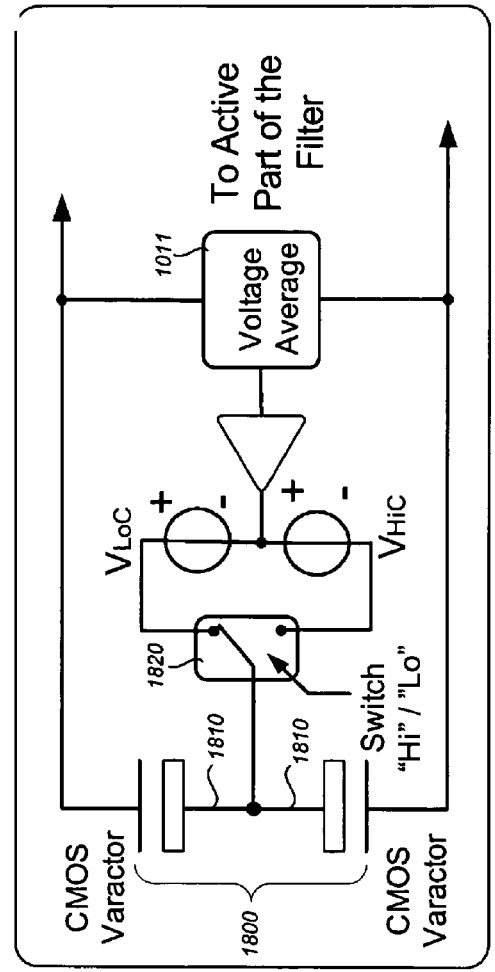
FIG. 18 illustrates a first exemplary embodiment of a setting of control voltages for a CMOS base varactor with respect to the OTAs bias voltage.

As an example, a method for setting the control voltages with respect to the OTAs bias voltage is depicted in FIG. 18. OTA bias average voltage is produced by combining the direct and inverted OTA collector voltages and is buffered to provide low impedance node. $V_{LoC}$ and $V_{HiC}$ are produced by setting fixed voltage level above ($V_{LoC}$) the average bias voltage and below ($V_{HiC}$). Since gate of varactor 1800 is active while voltage control is applied to a back side of varactor 1800 by voltage average circuit 1011, the capacitance dependence on control voltage is inverted. When switch (SW) 1820 connects back side 1810 of varactor 1800 to $V_{LoC}$ voltage as shown, capacitance is being reduced and when connects to $V_{HiC}$, capacitance is being increased as shown in FIG. 14.

Figure 19:
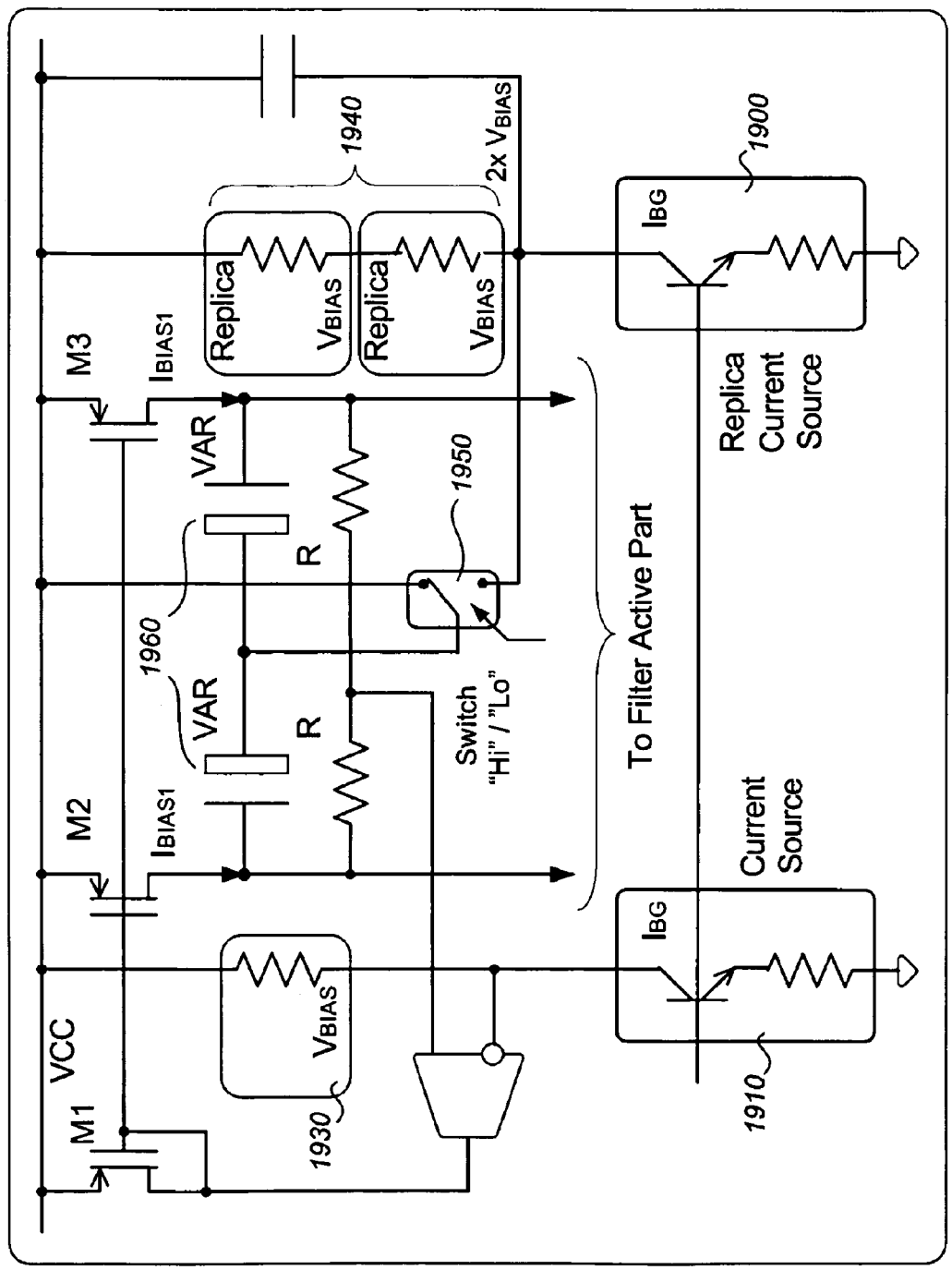
FIG. 19 illustrates a second exemplary embodiment of a setting of control voltages for a CMOS base varactor with respect to the OTAs bias voltage in order to produce a voltage equal to the average OTA bias voltage.

Another way to produce the voltage equal to the average OTA bias voltage is to use the replica of the bias voltage used to generate the bias currents in FIG. 19. Replica current source 1900 generates exactly the same current as current source 1910, which in turn produces exactly the same bias voltage on replica resistor 1940 that matches a resistor 1930 used to produce bias voltage.

Herein, a plurality of replica resistors 1940 connected in series are used to double the bias voltage. A switch 1950 is adapted to switch between voltages, namely VCC and $2 \cdot V_{BIAS}$, by switching varactors 1960 between high and low capacitance states. Since OTA average bias voltage is set to Vbias, switch 1950 will switch varactor voltage between ±Vbias. Since both Vbias and 2±Vbias are produced with respect to VCC, power supply variations are not impacting the voltages applied to varactors. For this to be true, current sources 1900 and 1910 have to have high impedance.

II. Output Buffer

Figure 20:
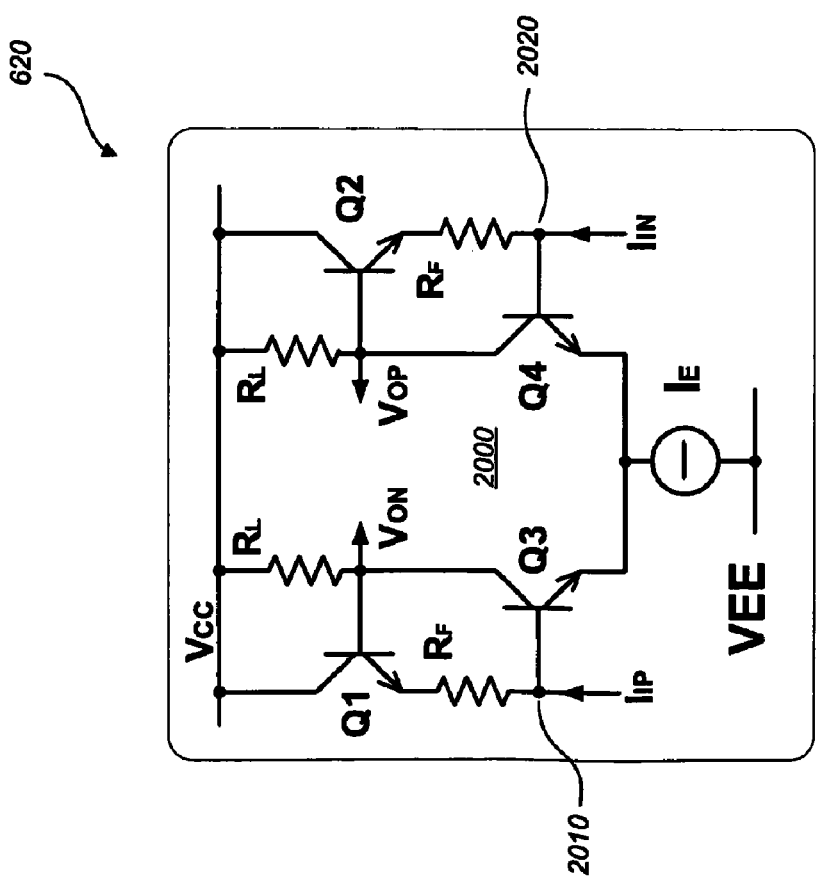
FIG. 20 is an exemplary embodiment of an output buffer of FIG. 6 with the output buffer featuring a transimpedance amplifier (TIA) is needed to convert current to voltage and amplify the voltage to produce necessary level.

The output of bi-quad circuit 960 is buffered by using an OTA which in turn produces current output. A transimpedance amplifier (TIA) is needed to convert current to voltage and amplify the voltage to produce necessary level. A circuit that implements described functions is in FIG. 20. Differential input currents $I_{IP}$ and $I_{IN}$ are converted into voltage with coefficient $|V_O/I_{IN}|=R_F$ (in case $g_m \cdot R_L \gg 1$). In order for this circuit would operate properly, voltage on input nodes 2010 and 2020 should be able to move down to $V_{CC}-I_E \cdot R_L - V_{BE} - I_{IP} \cdot R_F$, approximately 1.5V for 3.3V power supply voltage. This low voltage makes for a difficult implementation of the driving OTA.

Figure 21:
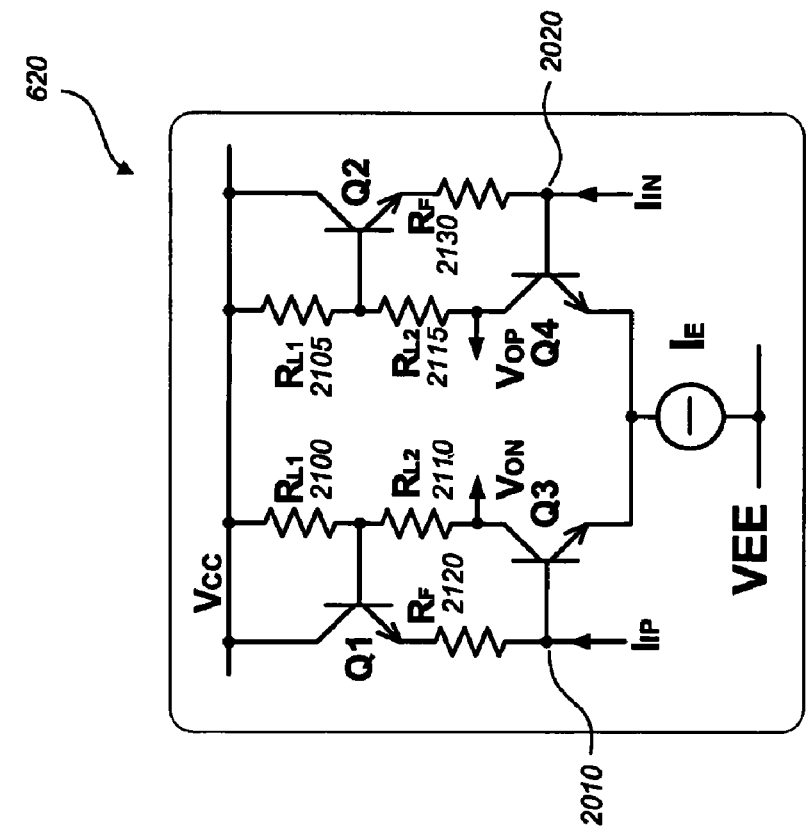
FIG. 21 is an exemplary embodiment of an output buffer of FIG. 6 with the output buffer featuring a split loading resistor.

In order to increase the voltage, the loading resistor $R_L$ may be split into resistors $R_{L1}$ 2100, 2105 and $R_{L2}$ 2110, 2115 as shown in FIG. 21. As a result, the gain of this amplifier is equal to $V_O/I_{IN}=R_F \cdot (R_{L1}+R_{L2})/R_{L1}$. So, the gain is increased by the division ratio of the resistor divider. The voltage on input nodes 2010 and 2020, moves up by $R_{L2} \cdot I_E$. Since the gain increased by introducing the signal divider in the feedback loop, in order to have the gain back, resistor $R_F$ 2120 and 2130 has to be reduced. Reducing of $R_F$ not only reduces the voltage drop on this resistor, but also increases the voltage on input nodes 2010 and 2020. This increases the headroom.

Figure 22:
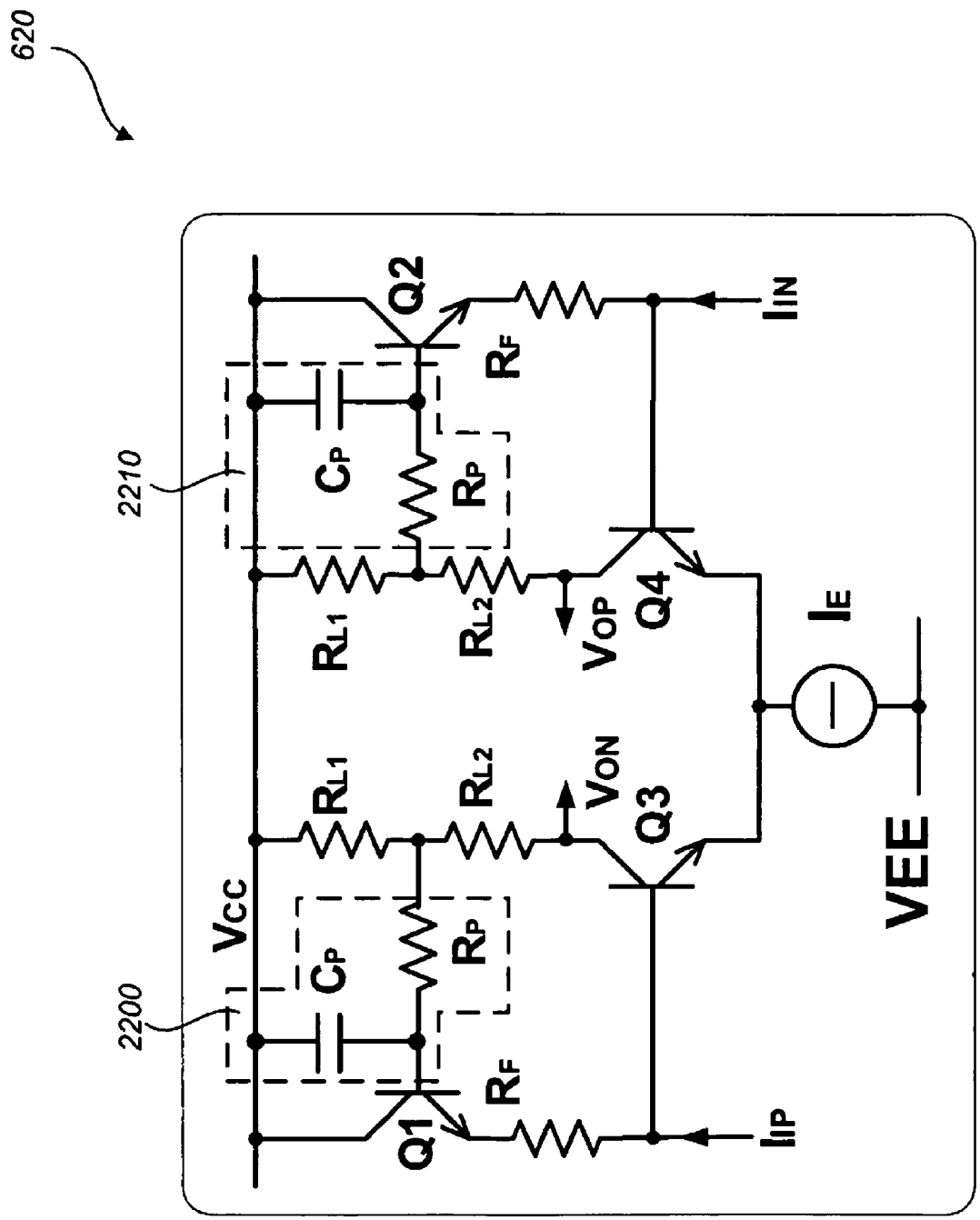
FIG. 22 is a first exemplary embodiment of an output buffer of FIG. 6 with extended cut-off frequency.

In order, the filter parameters are set by the parameters of the filter itself, output buffer as well as all other blocks should have their cutoff frequencies further away from the cutoff frequency of the filter. It is the best if the output buffer is "transparent" for the signal. For this reason, the bandwidth of the buffer should be as wide as possible. In order to increase the bandwidth of the output buffer, we are introducing a low pass RC filter 2200 and 2210 in the feedback loop as shown in FIG. 22.

Since RC filter 2200 is in the feedback loop, upon reaching the cutoff frequency, it starts reducing the depth of the negative feedback. Consequently the amplifier gain is increased. Correlating the feedback filter cutoff frequency with the amplifier cutoff frequency allows extending of the region of flat frequency response.

Figure 23:
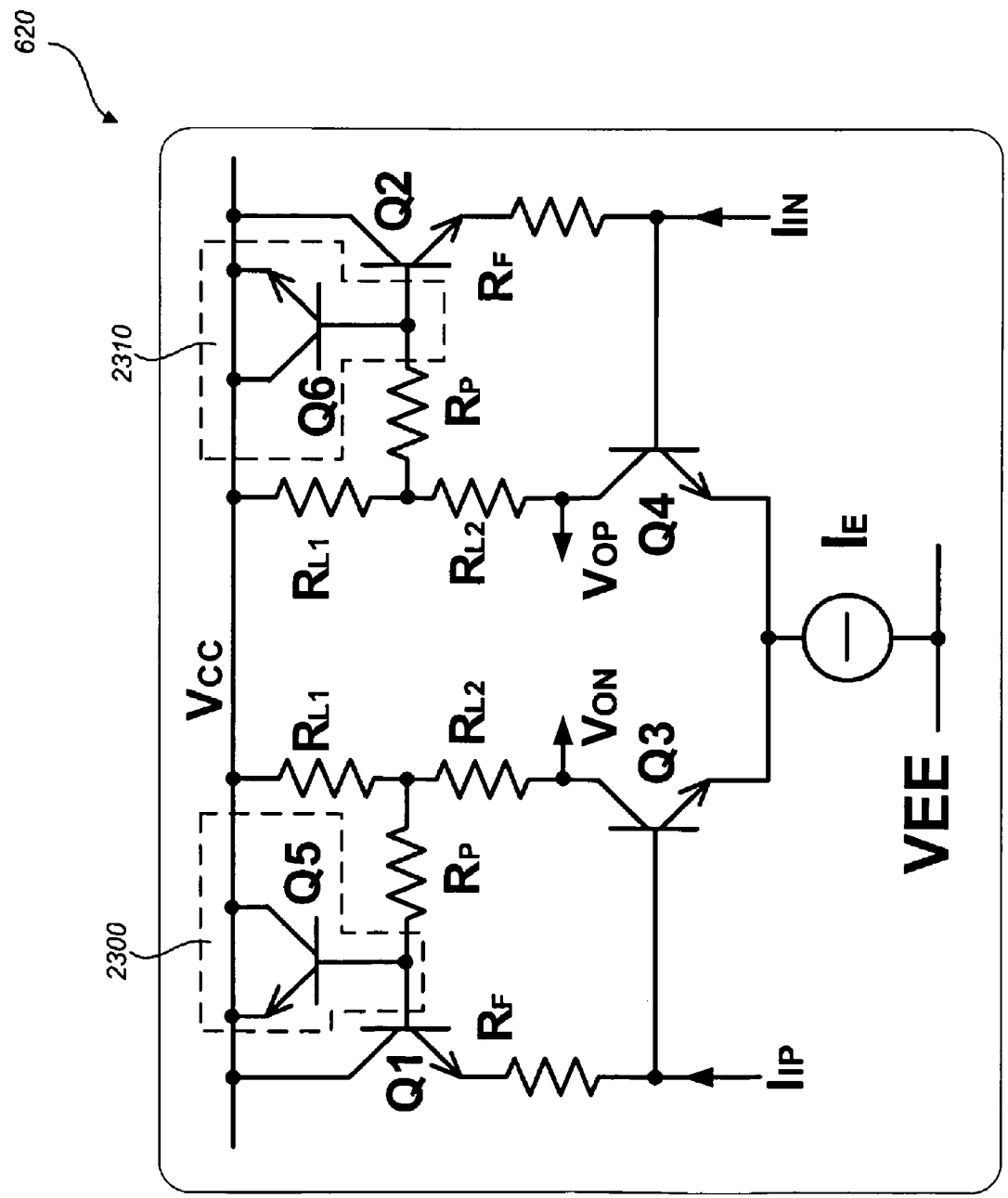
FIG. 23 is a second exemplary embodiment of an output buffer of FIG. 6 with extended cut-off frequency.

In order to make the filter in the feedback loop to correlate with the circuit cut-off frequency the capacitor is being replaced by a transistor Q5 2300 and Q6 2310 connected in reverse bias mode (FIG. 23). The amplifier cut-off frequency is set by the junction capacitances as well as the RC filter in the feedback loop. So, when cutoff frequency of the amplifier is reducing because of junction capacitance increasing, the low pass filter cutoff frequency is reducing too. Depth of the feedback is being reduced too. Overall gain of circuit 620 remains flat up to higher frequencies. The resistor $R_P$ in RC filter 2200 and 2210 is based on the same resistive layer as the other resistors in the circuit. This provided another means for correlating of the cut-off frequencies in the circuit.

III. Input Buffer (Voltage-to-Current Converter)

Figure 24A:
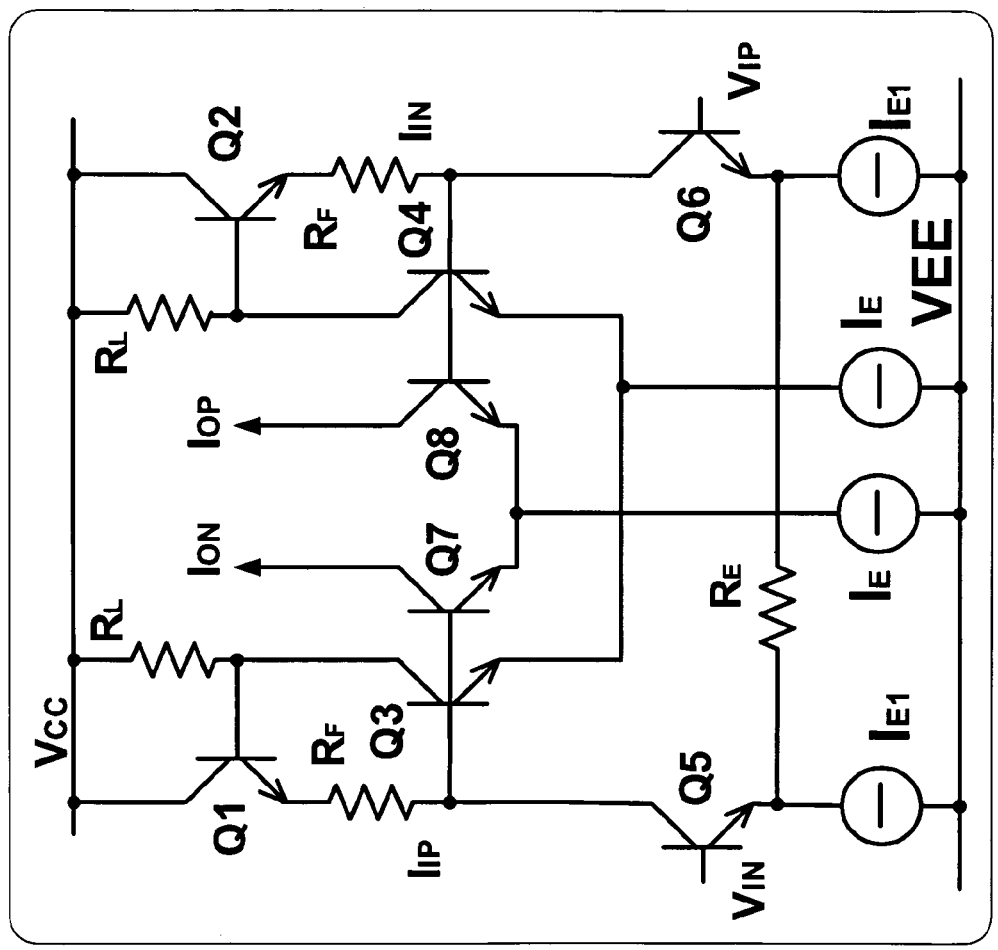
FIG. 24A is a first exemplary embodiment of an output buffer.

Referring now to FIG. 24A, a VGA output signal is in voltage domain, but the CTF input needs signals in the current domain. In order to translate the voltage domain to current, an OTA has to be used that introduces minimum nonlinearity distortion. Since the output buffer gain is proportional to $R_F$ and CTF transfer coefficient does not depend on resistance, in order to eliminate resistance dependence, input buffer should feature transfer coefficient proportional to 1/R. Hence, where $G_m=g_m/(1+R_E g_m)$, $G_m \approx 1/R_E$ if $R_E g_m \gg 1$.

To reduce buffer parameter dependence on the loading, an additional current amplifier stage is added consisting of OTA (Q3 and Q4) and active feedback circuit with $R_F$ as feedback resistor. Since $V_{RL}=I_{IN} \cdot R_F$, and $V_{RL}=I_{C3} \cdot R_L$, we have $I_{C3}=I_{IN} \cdot (R_F/R_L)$. As we see, the current transfer depends only on the resistor ratio. So, the combined gain is proportional to $1/R_E$. A replica OTA on Q7 and Q8 is used to pick up the signal in current domain. If emitter ratio of the transistors Q3, Q4, Q7 and Q8 are the same, as well as the tail currents of the OTAS, then the OTA on Q7, Q8 replicates the current as 1:1.

Figure 24B:
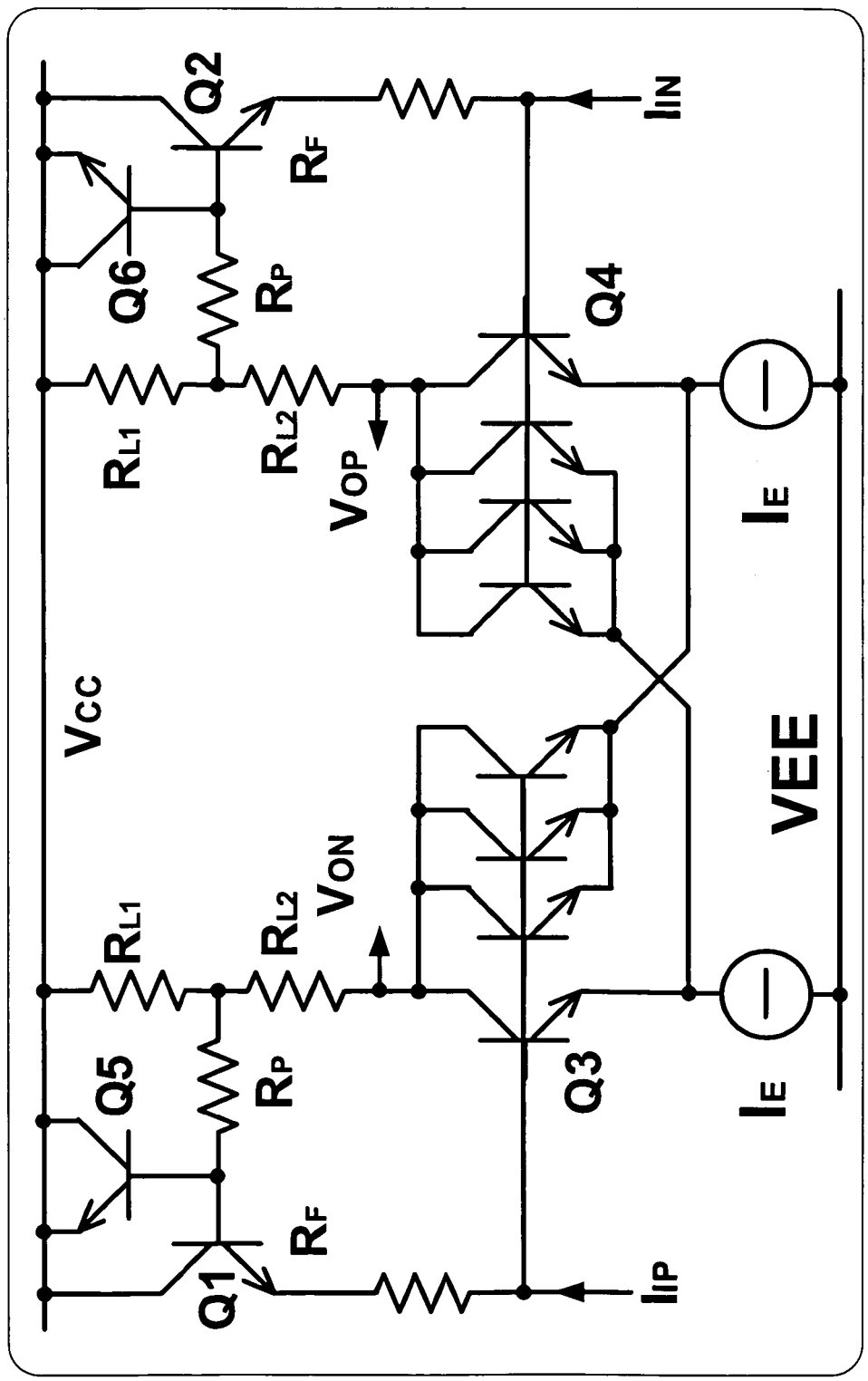
FIG. 24B is a second exemplary embodiment of an output buffer, where the output buffer is coupled to the CTF featuring linearized differential amplifier circuitry.

In order to improve the linearity, unbalanced differential amplifier based OTAs in both input and output buffers as shown in FIG. 24B.

Figure 25:
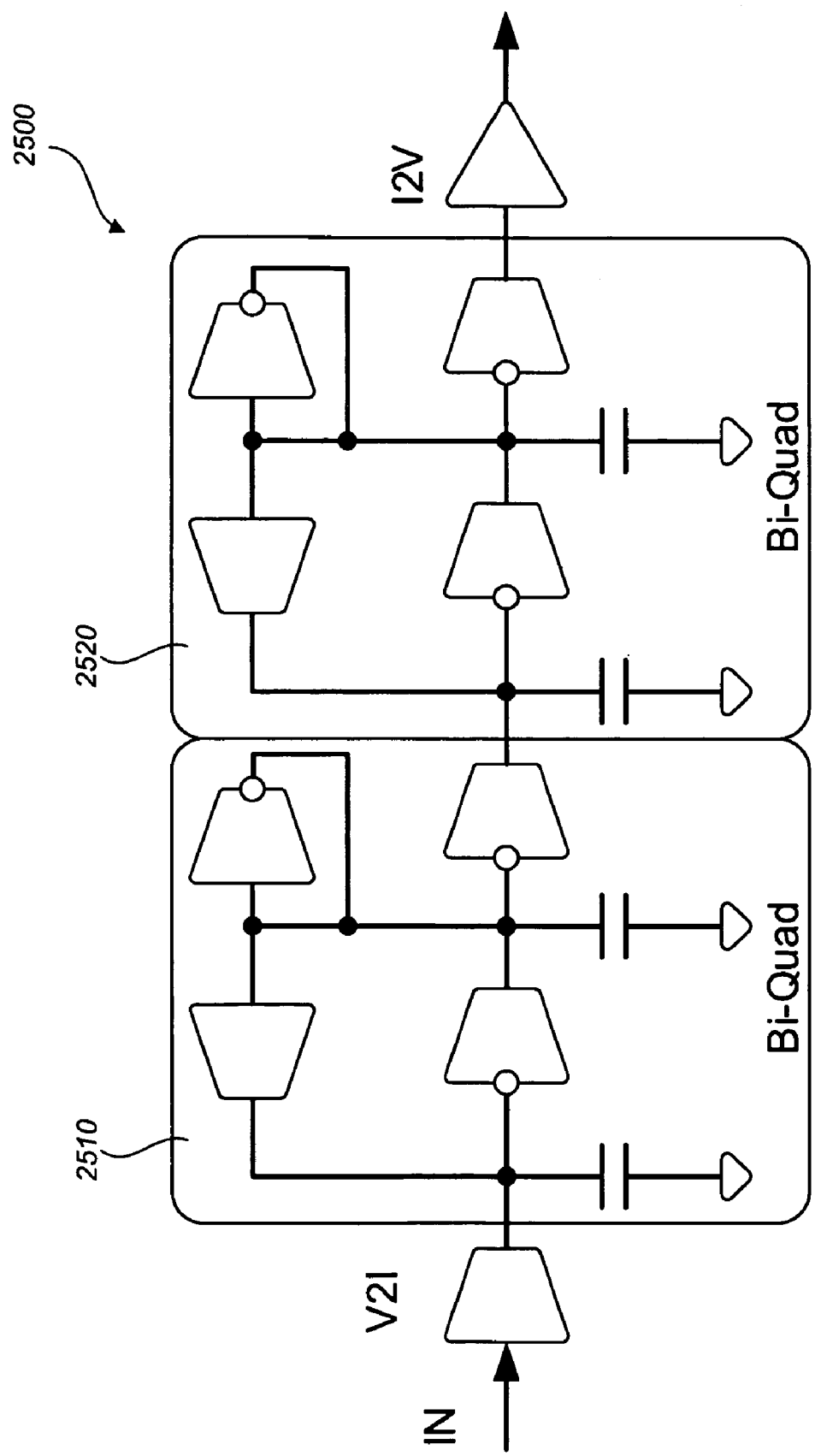
FIG. 25 is an exemplary embodiment of a fourth order low-pass filter implemented based on a combination of differential bi-quad circuits.
Figure 26:
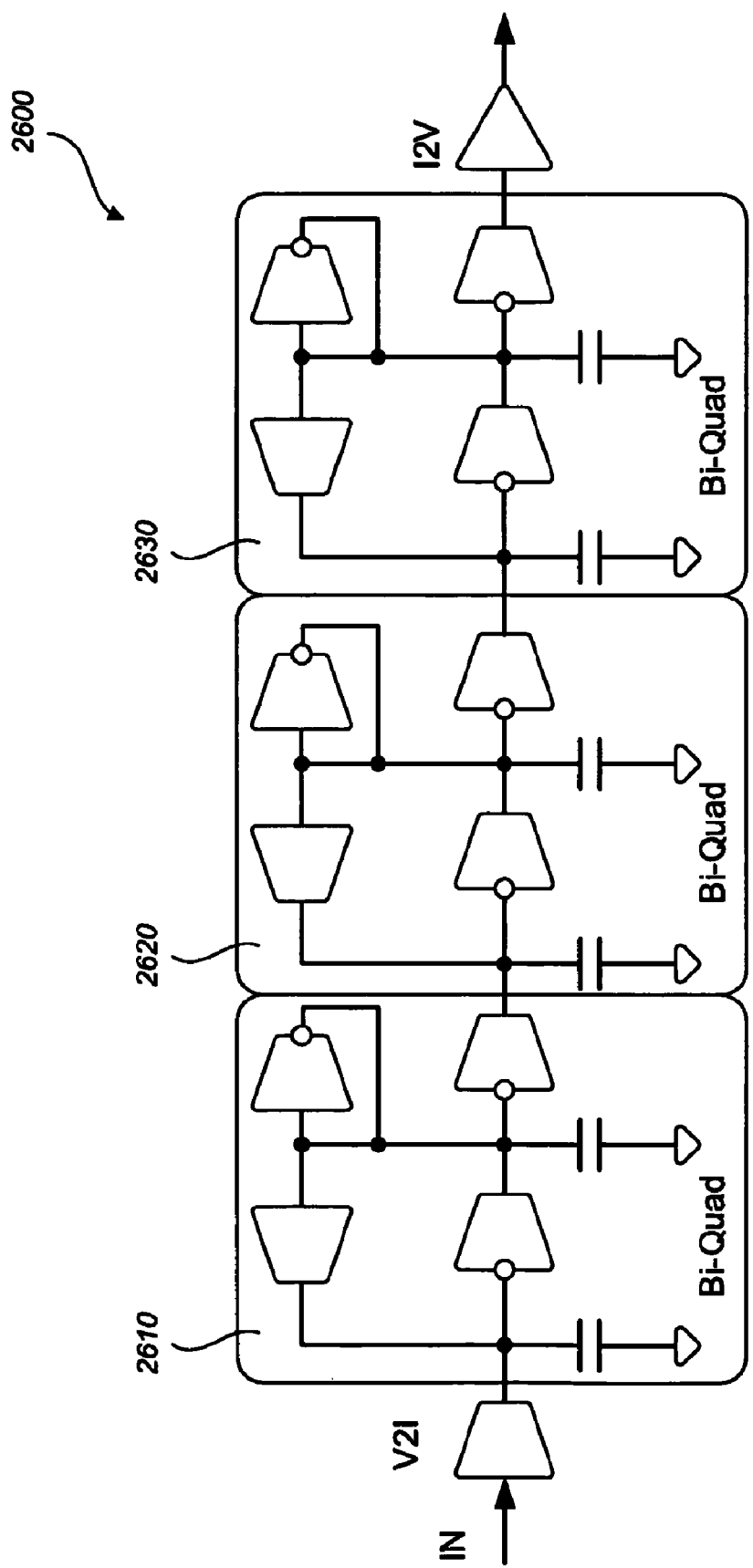
FIG. 26 is an exemplary embodiment of a sixth order low-pass filter implemented based on a combination of differential bi-quad circuits.

Filter order is being increased by adding filter stages. One stage provides $2^{nd}$ order response. A fourth ($4^{th}$) order low-pass filter 2500 with two stages of bi-quad circuits 2510 and 2520 is shown in FIG. 25 while a sixth ($6^{th}$) order low-pass filter 2600 with three stages of bi-quad circuits 2610, 2620 and 2630 is shown in FIG. 26.

Figure 27:
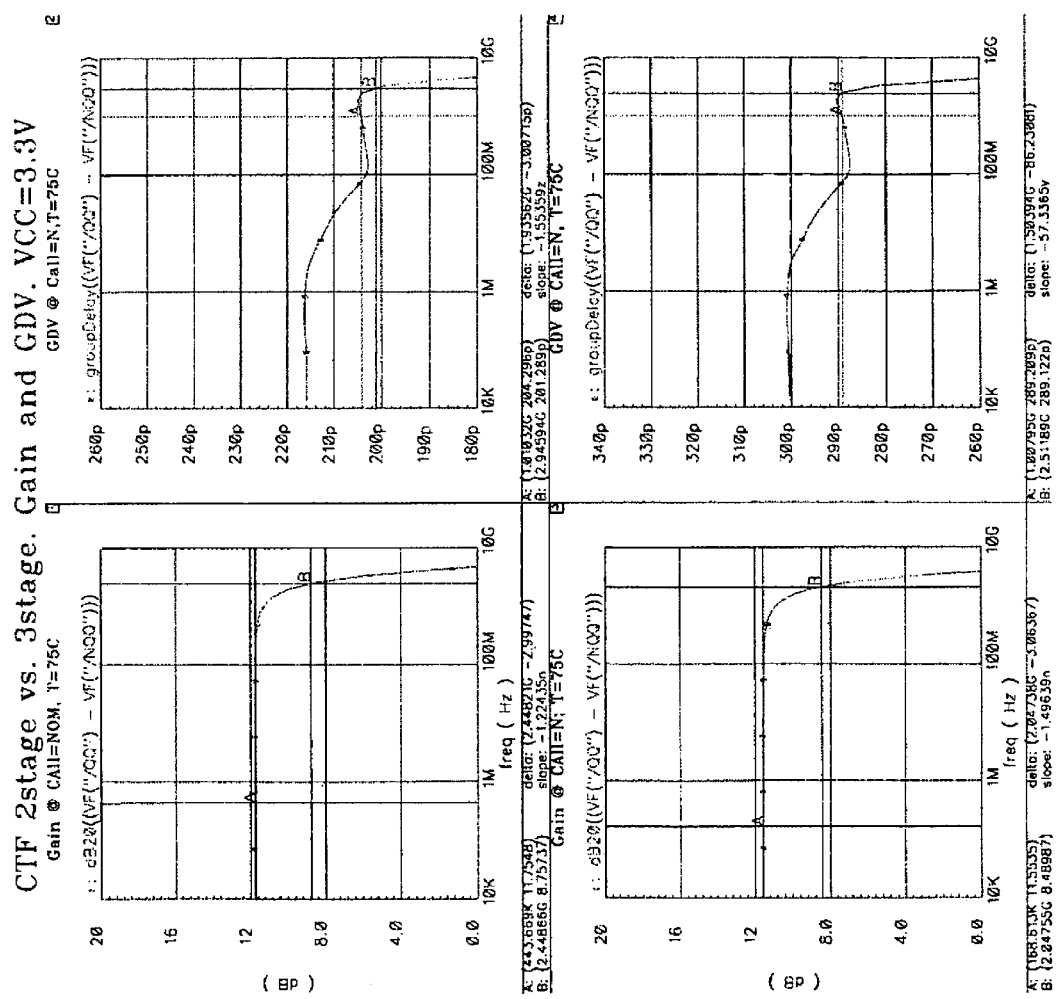
FIG. 27 is an exemplary embodiment of a frequency response of the CTF based on multiple bi-quad circuits.

When adding the filter stages together, the resulting cut-off frequency ($f_c$) point (−3 dB) is shifted to lower frequencies by about $\sqrt{N}$, where N is the number of bi-quads. The group delay doubles. In this case, the variation of the group delay will also double. However, only the group delay variation up to $1.2 \cdot f_c$ is important since the spectrum components above the frequency would be suppressed to the level they could be neglected. In case if the bi-quads have the group delay variation starting at low frequencies, combining the bi-quads will increase the group delay variation. If the group delay remains flat over frequency up to the $f_c$ point, series connection of the bi-quads improves group delay variation of the filter. In FIG. 27, frequency response of the CTF based on 2 and 3 bi-quads is presented. Frequency response of 2 bi-quad based filter is shown in upper graph while 3 bi-quad based filter response is in lower graphs. Group delay variation below 100 MHz is not effecting data eye. So, the group delay deviation from flat response is not important and is not considered. Group delay variation around the cut-off frequency point is important. As can be seen, 2 bi-quad series connection has 3 ps group delay roll-off when going from 1 GHz up to $1.2 \cdot f_c$ ($f_c$=2.5 GHz), while for 3 stage bi-quad the deviation is negligible going from same 1 GHz to $1.2 \cdot f_c$, ($f_c$=2.0 GHz).

While the invention has been described in terms of several embodiments, the invention should not be limited to only those embodiments described, but can be practiced with modification and alteration within the spirit and scope of the appended claims.

The invention claimed is:

1. A circuit comprising:
a first operational transconductance amplifier comprises differential inputs and differential outputs;
a second operational transconductance amplifier comprises (i) differential inputs including a first differential input and a second differential input, and (ii) a first differential output and a second differential output, a first output of the first operational transconductance amplifier being coupled to the first differential input being an inverting input and a second output of the first operational transconductance amplifier being coupled to the second differential input being a non-inverting input, the first differential output being coupled to a first input of the first operational transconductance amplifier, and the second differential output being coupled to a second input of the first operational transconductance amplifier for negative feedback and current biasing; and
a first biasing control circuit being coupled to the differential inputs of the first operational transconductance amplifier, the first biasing control circuit provides proper biasing voltage for the first operational transconductance amplifier by maintaining an average input voltage of the first operational transconductance amplifier equal to a reference voltage.

2. The circuit according to claim 1 further comprising a second biasing control circuit being coupled to the differential inputs of the second operational transconductance amplifier, the second biasing control circuit provides proper biasing voltage for the second operational transconductance amplifier by maintaining an average input voltage of the second operational transconductance amplifier equal to the reference voltage.

3. The circuit according to claim 2 further comprising a voltage-to-current converter coupled to the differential inputs of the first operational transconductance amplifier.

4. The circuit according to claim 3 further comprising a current-to-voltage converter coupled to the differential inputs of the second operational transconductance amplifier.

5. A circuit comprising:
an input buffer;
an output buffer; and
a continuous time filter interposed between and coupled to both the input buffer and the output buffer, the continuous time filter comprises a first operational transconductance amplifier comprises differential inputs and differential outputs,
a second operational transconductance amplifier comprises (i) differential inputs including a first differential input and a second differential input, and (ii) a first differential output and a second differential output, a first output of the first operational transconductance amplifier being coupled to the first differential input being an inverting input and a second output of the first operational transconductance amplifier being coupled to the second differential input being a non-inverting input, the first differential output being coupled to a first input of the first operational transconductance amplifier and the second differential output being coupled to a second input of the first operational transconductance amplifier for negative feedback and current biasing, and
a first biasing control circuit coupled to the differential inputs of the first operational transconductance amplifier, the first biasing control circuit provides proper biasing voltage for the first operational transconductance amplifier by maintaining an average input voltage of the first operational transconductance amplifier equal to a reference voltage.

6. The circuit according to claim 5, wherein the continuous time filter further comprises a second biasing control circuit being coupled to the differential inputs of the second operational transconductance amplifier, the second biasing control circuit provides proper biasing voltage for the second operational transconductance amplifier by maintaining an average input voltage of the second operational transconductance amplifier equal to the reference voltage.

7. The circuit according to claim 6, wherein the continuous time filter further comprises a voltage-to-current converter coupled to the differential inputs of the first operational transconductance amplifier.

8. The circuit according to claim 7, wherein the continuous time filter further comprises a current-to-voltage converter coupled to the differential inputs of the second operational transconductance amplifier.

9. The circuit according to claim 5, wherein the output buffer further comprises circuitry forming a feedback loop to reduce a cutoff frequency of an amplifier implemented within the output buffer, the circuitry includes a first transistor and a second transistor connected in a reverse bias mode.

* * * * *